(12) United States Patent
Yang et al.

(10) Patent No.: US 7,034,474 B2
(45) Date of Patent: Apr. 25, 2006

(54) AUTO-CALIBRATION OF ATTRACTION-ONLY TYPE ACTUATOR COMMUTATIONS

(75) Inventors: Pai Hsueh Yang, Palo Alto, CA (US); Tim Teng, Fremont, CA (US); Kazuhiro Hirano, Saitama (JP); Bausan Yuan, San Jose, CA (US)

(73) Assignee: Nikon Corporation, (JP)

( * ) Notice: Subject to any disclaimer, the term of this patent is extended or adjusted under 35 U.S.C. 154(b) by 171 days.

(21) Appl. No.: 10/775,720

(22) Filed: Feb. 9, 2004

(65) Prior Publication Data

US 2005/0173992 A1   Aug. 11, 2005

(51) Int. Cl.
*H02K 41/00* (2006.01)

(52) U.S. Cl. .................. 318/135; 310/12; 250/491.1; 355/72

(58) Field of Classification Search ............... 318/135; 250/491.1; 355/72; 310/12

See application file for complete search history.

(56) References Cited

U.S. PATENT DOCUMENTS 6,281,655 B1 *  8/2001  Poon et al. .................. 318/649
6,486,941 B1 * 11/2002  Hazelton et al. .............. 355/72

* cited by examiner

*Primary Examiner*—Darren Schuberg
*Assistant Examiner*—Judson H. Jones
(74) *Attorney, Agent, or Firm*—Steven G. Roeder; Jim Rose

(57) ABSTRACT

A stage assembly (220) for moving a device (200) includes a stage (208), an attraction-only type actuator pair (426) that moves the stage (208), and a control system (24). In one embodiment, the actuator pair (426) includes a first electromagnet (436F), a first conductor (438F) and a first target (440F) having a first target surface (442F). The actuator pair also includes a second electromagnet (436S), a second conductor (438S) and a second target (440S) having a second target surface (442S). The first electromagnet (436F) is positioned at a first angle $\theta_1$ relative to a first target surface (442F) and the second electromagnet (436S) is positioned at a second angle $\theta_2$ relative to the second target surface (442S). The control system (24) directs a first current to one or more of the electromagnets based on at least one of the angles $\theta_1, \theta_2$. Further, one or more electromagnets (436) can include a first measurement point and a second measurement point. The control system (24) can direct current to the actuator pair (426) based on the relative distance between the first and second measurement points and the corresponding target surface (442).

53 Claims, 15 Drawing Sheets

AUTO-CALIBRATION OF ATTRACTION-ONLY TYPE ACTUATOR COMMUTATIONS

FIELD OF THE INVENTION

The present invention relates generally to a precision assembly including a control system that more precisely calibrates and/or adjusts the position and/or movement of a stage within the precision assembly.

BACKGROUND

Precision assemblies such as exposure apparatuses are commonly used to transfer images from a reticle onto a semiconductor wafer during semiconductor processing. A typical exposure apparatus includes an illumination source, a reticle stage assembly having a reticle stage that retains a reticle, an optical assembly, a wafer stage assembly having a wafer stage that retains a semiconductor wafer, a measurement system, and a control system. Additionally, one or more of the stage assemblies can include a mover assembly that precisely positions the stage(s).

The size of the images and features within the images transferred onto the wafer from the reticle are extremely small. Accordingly, the precise positioning of the wafer and the reticle relative to the optical assembly is critical to the manufacture of high density, semiconductor wafers. Recently, one or more attraction only-type actuators have been used in the mover assemblies. For example, attraction-only type actuators can include one or more E/I core type actuators. The E/I core type actuator can include a somewhat "E" shaped electromagnet and a somewhat "I" shaped target that is positioned near the electromagnet. Among other configurations, attraction-only type actuators can include CI core type actuators which use a "C" shaped electromagnet.

Each "E" shaped electromagnet can have two wings and a center section. An electrical coil is typically wound around the center section of the "E". Between the electromagnet and the target is a relatively small gap (also referred to herein as the "gap distance") which can typically range from between zero and 500 microns. Current directed through the coil creates an electromagnetic field that attracts the target toward the electromagnet, effectively decreasing the gap between the electromagnet and the target. The amount of current to be directed to the electromagnet is based at least partially upon the gap distance. The gap distance can be monitored to increase positioning accuracy of the stage, and to reduce the likelihood of a collision between the electromagnet and the target, which could damage components of the precision assembly.

In light of the above, there is a need for a precision assembly that can determine misalignments between the electromagnets and the targets in the mover assemblies. Further, there is a need for a control system that can account for any such misalignments by more precisely controlling the amount of current that is directed to the electromagnets based at least partially on the presence and/or the extent of such misalignments.

SUMMARY

The present invention is directed to a stage assembly that includes a stage, a mover assembly that moves the stage, and a control system. In one embodiment, the mover assembly includes an attraction-only type first actuator having a first electromagnet, and a first target having a first target surface that generally faces the first electromagnet. In this embodiment, the first electromagnet is positioned at a first angle with an absolute value of greater than zero relative to the first target surface. In one embodiment, the first electromagnet can include an E core, and the first target can include an I core. In one embodiment, the control system directs a first current to the first actuator based on the first angle.

Further, the first electromagnet can include a first measurement point that is spaced apart a first physical gap $g_1$ from the first target surface, and a spaced apart second measurement point that is spaced apart a second gap $\bar{g}_1$ from the first target surface. The first gap $g_1$ can be different than the second gap $\bar{g}_1$. The control system can direct the first current to the first actuator based on $g_1$ and $\bar{g}_1$.

In another embodiment, the mover assembly includes an attraction-only type second actuator that cooperates with the first actuator to move the stage. The second actuator includes a second electromagnet and a second target having a second target surface that generally faces the second electromagnet. The second electromagnet can be positioned at a second angle relative to the second target surface which may or may not have an absolute value of greater than zero. In this embodiment, the control system can direct a second current to the second actuator based on the second angle.

In an alternative embodiment, the second electromagnet can include a first measurement point that is spaced apart from the second target surface by a first physical gap $g_2$, and a spaced apart second measurement point that is spaced apart from the second target surface by a second gap $\bar{g}_2$. The control system can direct the second current to the second actuator based on $g_2$ and $\bar{g}_2$.

The present invention is also directed to a precision assembly, an exposure apparatus, a wafer, a device, a method for positioning a stage, a method for using an exposure apparatus, a method for making a wafer, and a method for making an object.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
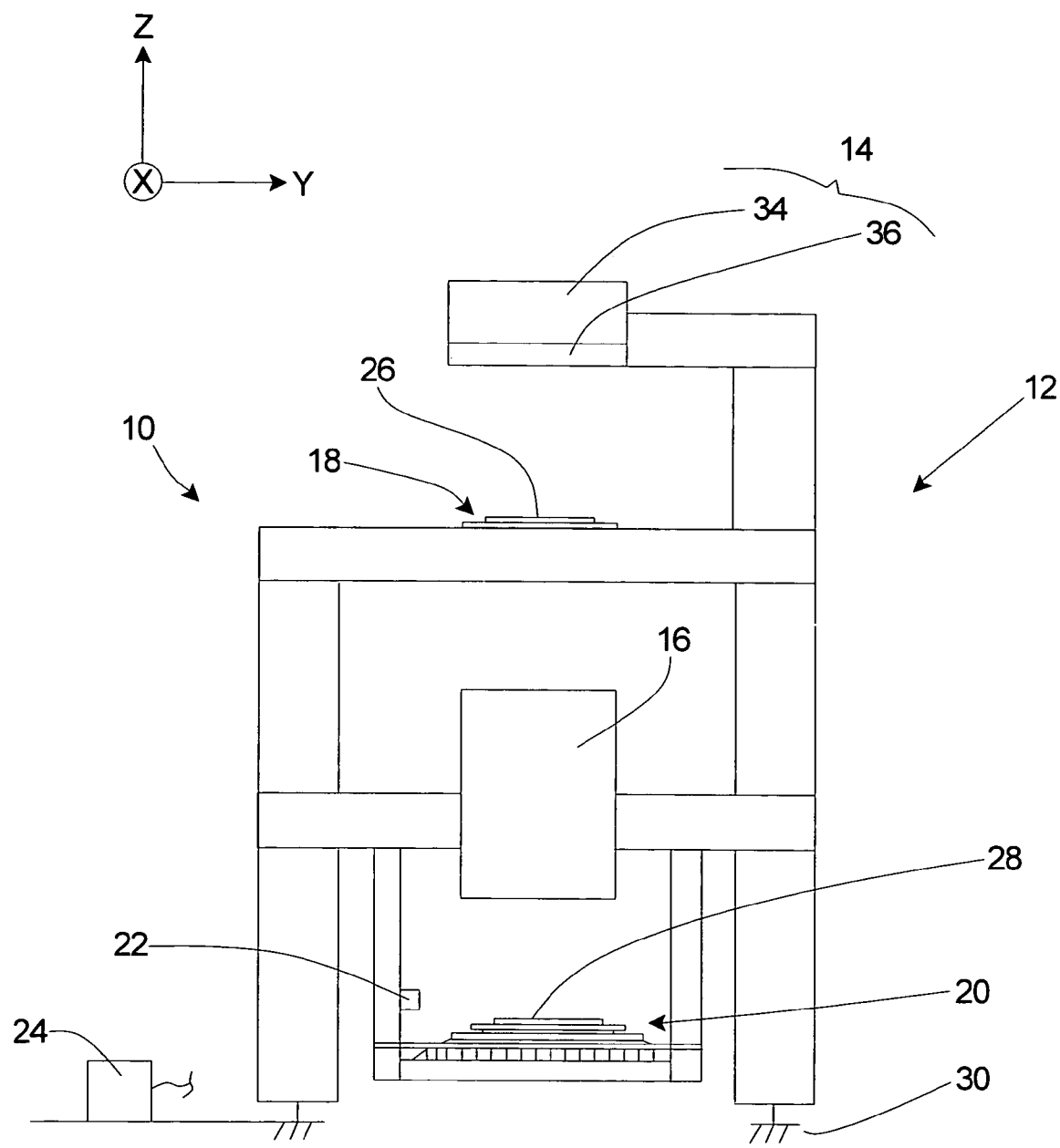
FIG. 1 is a schematic view of a precision assembly having features of the present invention.

FIG. 1 is a schematic illustration of a precision assembly 10, namely an exposure apparatus, having features of the present invention. The precision assembly 10 includes an apparatus frame 12, an illumination system 14 (irradiation apparatus), an optical assembly 16, a reticle stage assembly 18, a wafer stage assembly 20, a measurement system 22, and a control system 24. The design of the components of the precision assembly 10 can be varied to suit the design requirements of the precision assembly 10.

As provided herein, the control system 24 utilizes a commutation formula that includes one or more calibration algorithms that improve the accuracy in the control of one or more of the stage assemblies 18, 20.

A number of Figures include an orientation system that illustrates an X axis, a Y axis that is orthogonal to the X axis and a Z axis that is orthogonal to the X and Y axes. It should be noted that these axes can also be referred to as the first, second and third axes, respectively.

The precision assembly 10 can be particularly useful as a lithographic device that transfers a pattern (not shown) of an integrated circuit from a reticle 26 onto a semiconductor wafer 28. The precision assembly 10 mounts to a mounting base 30, e.g., the ground, a base, or floor or some other supporting structure.

There are a number of different types of lithographic devices. For example, the precision assembly 10 can be used as scanning type photolithography system that exposes the pattern from the reticle 26 onto the wafer 28 with the reticle 26 and the wafer 28 moving synchronously. In a scanning type lithographic device, the reticle 26 is moved perpendicularly to an optical axis of the optical assembly 16 by the reticle stage assembly 18 and the wafer 28 is moved perpendicularly to the optical axis of the optical assembly 16 by the wafer stage assembly 20. Scanning of the reticle 26 and the wafer 28 occurs while the reticle 26 and the wafer 28 are moving synchronously.

Alternatively, the precision assembly 10 can be a step-and-repeat type photolithography system that exposes the reticle 26 while the reticle 26 and the wafer 28 are stationary. In the step and repeat process, the wafer 28 is in a constant position relative to the reticle 26 and the optical assembly 16 during the exposure of an individual field. Subsequently, between consecutive exposure steps, the wafer 28 is consecutively moved with the wafer stage assembly 20 perpendicularly to the optical axis of the optical assembly 16 so that the next field of the wafer 28 is brought into position relative to the optical assembly 16 and the reticle 26 for exposure. Following this process, the images on the reticle 26 are sequentially exposed onto the fields of the wafer 28 so that the next field of the wafer 28 is brought into position relative to the optical assembly 16 and the reticle 26.

However, the use of the precision assembly 10 provided herein is not limited to a photolithography system for semiconductor manufacturing. The precision assembly 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports the components of the precision assembly 10. The apparatus frame 12 illustrated in FIG. 1 supports the optical assembly 16 and the illumination system 14 above the mounting base 30.

The illumination system 14 includes an illumination source 34 and an illumination optical assembly 36. The illumination source 34 emits a beam (irradiation) of light energy. The illumination optical assembly 36 guides the beam of light energy from the illumination source 34 to the optical assembly 16. The beam illuminates selectively different portions of the reticle 26 and exposes the wafer 28. In FIG. 1, the illumination source 34 is illustrated as being supported above the reticle stage assembly 18. Typically, however, the illumination source 34 is secured to one of the sides of the apparatus frame 12 and the energy beam from the illumination source 34 is directed to above the reticle stage assembly 18 with the illumination optical assembly 36.

The illumination source 34 can be a g-line source (436 nm), an i-line source (365 nm), a KrF excimer laser (248 nm), an ArF excimer laser (193 nm) or a $F_2$ laser (157 nm). Alternatively, the illumination source 34 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the precision assembly 10, the optical assembly 16 can magnify or reduce the image illuminated on the reticle 26. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377, as well as Japan Patent Application Disclosure No. 10-3039 and its counterpart U.S. Pat. No. 5,805,357, also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 26 relative to the optical assembly 16 and the wafer 28. Somewhat similarly, the wafer stage assembly 20 holds and positions the wafer 28 with respect to the projected image of the illuminated portions of the reticle 26. The wafer stage assembly 20 is described in more detail below.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224 and 8-136475. As far as is permitted, the disclosures in U.S. Pat. Nos. 5,528,100 and 5,874,820 and Japanese Patent Application Disclosure No. 8-330224 are incorporated herein by reference.

The measurement system 22 monitors movement of the reticle 26 and/or the wafer 28 relative to the optical assembly 16 or some other reference. With this information, the control system 24 can control the reticle stage assembly 18 to precisely position the reticle 26 and/or the wafer stage assembly 20 to precisely position the wafer 28. For example, the measurement system 22 can utilize multiple laser interferometers, encoders, and/or other measuring devices.

The control system 24 is connected to the reticle stage assembly 18, the wafer stage assembly 20, and the measurement system 22. The control system 24 receives information from the measurement system 22 and controls one or both of the stage mover assemblies of the reticle stage assembly 18 and the wafer stage assembly 20 to precisely position the reticle 26 and/or the wafer 28. The control system 24 includes one or more processors and circuits for performing the functions described herein. A portion of the control system 24 is described in more detail below.

A photolithography system (e.g. an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2:
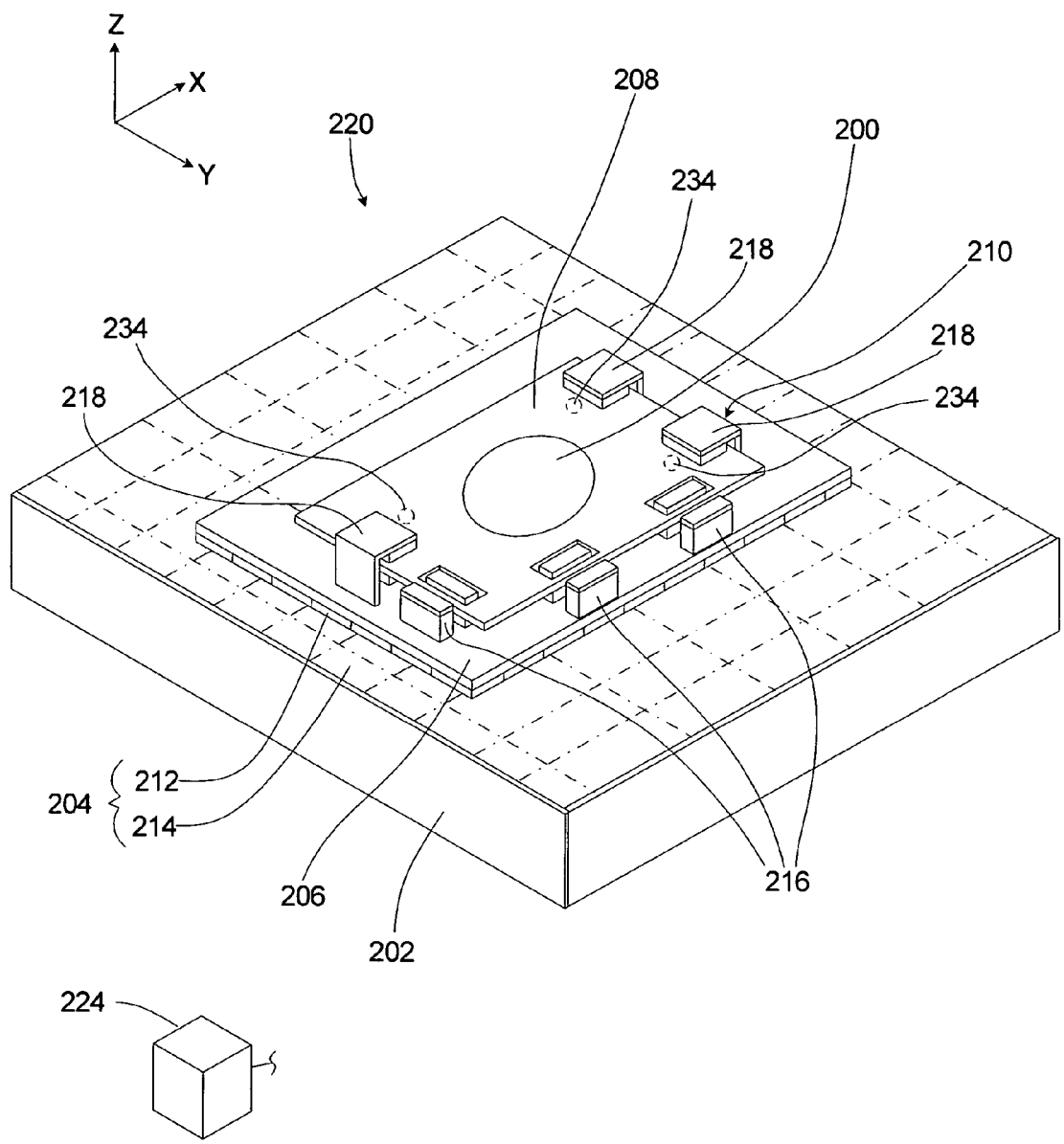
FIG. 2 is a perspective view of a stage assembly having features of the present invention.

FIG. 2 is a perspective view of a stage assembly 220 that is used to position a device 200 and a control system 224. For example, the stage assembly 220 can be used as the wafer stage assembly 20 in the precision assembly 10 of FIG. 1. In this embodiment, the stage assembly 220 would position the wafer 28 (illustrated in FIG. 1) during manufacturing of the semiconductor wafer 28. Alternatively, the stage assembly 220 can be used to move other types of devices 200 during manufacturing and/or inspection, to move a device under an electron microscope (not shown), or to move a device during a precision measurement operation (not shown). For example, the stage assembly 220 could be used as the reticle stage assembly 18. It should be noted that the control system 224 is sometimes referred to as being part of the stage assembly 220.

In this embodiment, the stage assembly 220 includes a stage base 202, a first stage mover assembly 204, a first stage 206, a second stage 208 and a second stage mover assembly 210. The design of the components of the stage assembly 220 can be varied. For example, in FIG. 2, the stage assembly 220 includes one first stage 206 and one second stage 208. Alternatively, however, the stage assembly 220 could be designed to include greater or fewer than one first stage 206, or greater or fewer than one second stage 208. The second stage 208 is also sometimes referred to herein as a "stage".

In FIG. 2, the stage base 202 is generally rectangular shaped. Alternatively, the stage base 202 can be another shape. The stage base 202 supports some of the components of the stage assembly 220 above the mounting base 30 illustrated in FIG. 2.

The design of the first stage mover assembly 204 can be varied to suit the movement requirements of the stage assembly 220. In one embodiment, the first stage mover assembly 204 includes one or more movers, such as rotary motors, voice coil motors, linear motors utilizing a Lorentz force to generate drive force, electromagnetic actuators, planar motor, or some other force actuators.

In FIG. 2, the first stage mover assembly 204 moves the first stage 206 relative to the stage base 202 along the first axis, along the second axis, and about the third axis. Additionally, the first stage mover assembly 204 could be designed to move and position the first stage 206 along the third axis, about the first axis and about the second axis relative to the stage base 202. Alternatively, for example, the first stage mover assembly 204 could be designed to move the first stage 206 with less than three degrees of freedom.

In the embodiment illustrated in FIG. 2, the first stage mover assembly 204 includes a planar motor. In this embodiment, the first stage mover assembly 204 includes a first mover component 212 that is secured to and moves with the first stage 206 and a second mover component 214 (illustrated in phantom) that is secured to the stage base 202. The design of each component can be varied. For example, one of the mover components 212, 214 can include a magnet array having a plurality of magnets and the other of the mover components 214, 212 can include a conductor array having a plurality of conductors.

In FIG. 2, the first mover component 212 includes the magnet array and the second mover component 214 includes the conductor array. Alternatively, the first mover component 212 can include the conductor array and the second mover component 214 can include the magnet array. The size and shape of the conductor array and the magnet array and the number of conductors in the conductor array and the number of magnets in the magnet array can be varied to suit design requirements.

The first mover component 212 can be maintained above the second mover component 214 with vacuum pre-load type air bearings (not shown). With this design, the first stage 206 is movable relative to the stage base 202 with three degrees of freedom, namely along the first axis, along the second axis, and rotatable around the third axis. Alternatively, the first mover component 212 could be supported above the second mover component 214 by other ways, such as guides, a rolling type bearing, or by the magnetic levitation forces and/or the first stage mover assembly 204 could be designed to be movable with six degrees of freedom. Still alternatively, the first stage mover assembly 204 could be designed to include one or more electromagnetic actuators.

The control system 224 directs electrical current to one or more of the conductors in the conductor array. The electrical current through the conductors causes the conductors to interact with the magnetic field of the magnet array. This generates a force between the magnet array and the conductor array that can be used to control, move, and position the first mover component 212 and the first stage 206 relative to the second mover component 214 and the stage base 202. The control system 224 adjusts and controls the current level for each conductor to achieve the desired resultant forces. Stated another way, the control system 224 directs current to the conductor array to position the first stage 206 relative to the stage base 202.

The second stage 208 includes a device holder (not shown) that retains the device 200. The device holder can include a vacuum chuck, an electrostatic chuck, or some other type of clamping device.

The second stage mover assembly 210 moves and adjusts the position of the second stage 208 relative to the first stage 206. For example, the second stage mover assembly 210 can adjust the position of the second stage 208 with six degrees of freedom. Alternatively, for example, the second stage mover assembly 210 can be designed to move the second stage 208 with only three degrees of freedom. The second stage mover assembly 210 can include one or more rotary motors, voice coil motors, linear motors, electromagnetic actuators, or other type of actuators. Still alternatively, the second stage 208 can be fixed to the first stage 206.

In the embodiment illustrated in FIG. 2, the second stage mover assembly 210 includes three spaced apart, horizontal movers 216 and three spaced apart, vertical movers 218. The horizontal movers 216 move the second stage 208 along the first axis, along the second axis and about the third axis relative to the stage 206 while the vertical movers 218 move the second stage 208 about the first axis, about the second axis and along the third axis relative to the stage 206.

In FIG. 2, each of the horizontal movers 216 and each of the vertical movers 218 includes an attraction-only actuator pair 226 comprising two electromagnetic actuators 228 (illustrated as blocks in FIG. 2). The attraction-only actuator pair is also referred to herein as an E/I core actuator pair, for example. Alternatively, for example, one or more of the horizontal movers 216 and/or one or more of the vertical movers 218 can include a voice coil motor or another type of mover.

In FIG. 2, (i) one of the E/I core actuator pairs 226 (one of the horizontal movers 216) is mounted so that the attractive forces produced thereby are substantially parallel with the first axis, (ii) two of the actuator pairs 226 (two of the horizontal movers 216) are mounted so that the attractive forces produced thereby are substantially parallel with the second axis, and (iii) three actuator pairs 226 (the vertical horizontal movers 216) are mounted so that the attractive forces produced thereby are substantially parallel with the third axis. With this arrangement, (i) the horizontal movers 216 can make fine adjustments to the position of the second stage 208 along the first axis, along the second axis, and about the third axis, and (ii) the vertical movers 218 can make fine adjustments to the position of the second stage 208 along the third axis, about the first axis, and about the second axis.

Alternatively, for example, two E/I core actuator pairs 226 can be mounted parallel with the first direction and one actuator pair 226 could be mounted parallel with the second direction. Still alternatively, other arrangements of the E/I core actuator pairs 226 are also possible.

The control system 224 directs current to the E/I core actuator pairs 226 to position the second stage 208.

In one embodiment, the measurement system 22 (illustrated in FIG. 1) includes one or more sensors (not shown in FIG. 2) that monitor the position of the second stage 208 relative to the first stage 206 and/or the position of second stage 208 relative to another structure, such as the optical assembly 16 (illustrated in FIG. 1).

Additionally, in FIG. 2, the second stage mover assembly 210 includes one or more stage supports 234 (illustrated in phantom) that extend between the stages 206, 208, support the dead weight of the second stage 208 relative to the first stage 206 and reduce the likelihood of overheating of the vertical movers 218. For example, each stage support 234 can be a fluid bellow. Alternatively, for example, each stage support 234 can be a spring or another type of resilient member.

Figure 3A:
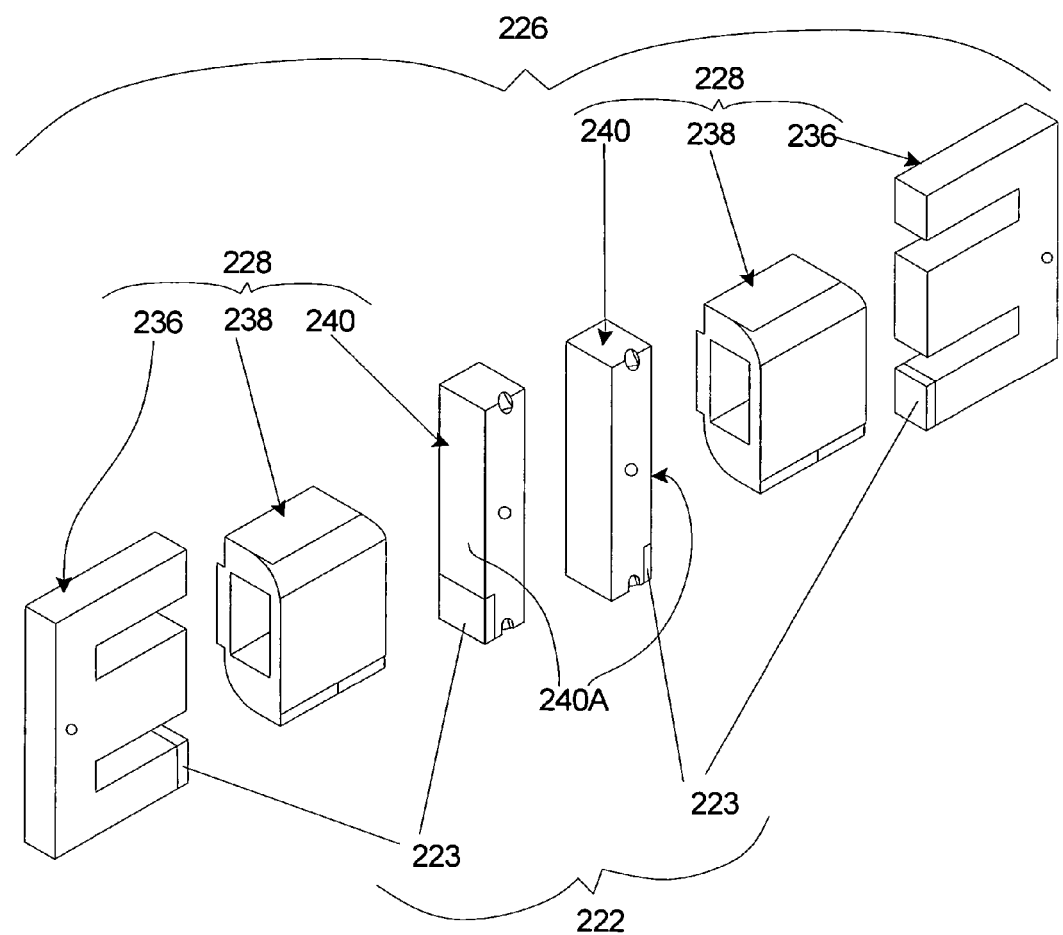
FIG. 3A is a perspective view of an E/I core actuator pair having features of the present invention.

FIG. 3A is an exploded perspective view of an embodiment of an attraction-only actuator pair. In this embodiment, the attraction-only actuator pair is known as an E/I core actuator pair 226 that can be used for one of the horizontal movers or one of the vertical movers. More specifically, FIG. 3A illustrates two attraction-only, electromagnetic actuators 228 commonly referred to as an E/I core actuators, or simply, actuators. Each E/I core actuator is essentially an electro-magnetic attractive device. The E/I core actuator 228 includes an E shaped core 236 ("E core"), a tubular shaped conductor 238, and an I shaped core 240 ("I core"). The E core 236 and the I core 240 are each made of a magnetic material such as iron, silicon steel or Ni—Fe steel. The conductor 238 is positioned around the center bar of the E core 236.

In embodiments that utilize the E/I core actuator pair, the combination of the E core 236 and the conductor 238 is sometimes referred to herein as an electromagnet, while the I core 240 is sometimes referred to herein as a target. Each target includes a target surface 240A that generally faces the corresponding E core.

The electromagnets can be mounted to the first stage 206 (illustrated in FIG. 2) and the targets can be secured to the second stage 208 (illustrated in FIG. 2) positioned between opposing electromagnets. In one embodiment, the I cores 240 are attached to the second stage 208 in such a way that the pulling forces of the opposing actuator pairs 226 do not substantially distort the second stage 208. In one embodiment, the I cores 240 can be integrally formed into the second stage 208. However, the configuration of the cores can be reversed and the I cores can be the secured to the first stage 206 and the E cores can be secured to the second stage 208. Still alternatively, the I cores can be secured to the second stage 208, and the E cores can be secured to another structure within the precision assembly 10.

The actuators 228 illustrated in FIG. 3A are variable reluctance actuators and the reluctance varies with the distance defined by the gap which, of course also varies the flux and the force applied to the target.

In this embodiment, the measurement system 222 includes one or more sensors 223 that can measure the gap distance between a portion of the E core 236 and a portion of the I core 240 for each actuator 228. A suitable sensor 223, for example, can include a capacitor sensor. Additionally, gap measurements can be performed by other methods, such as by using shims (not shown) to measure the gap distance between a portion of the E core 236 and a portion of the I core 240.

Figure 3B:
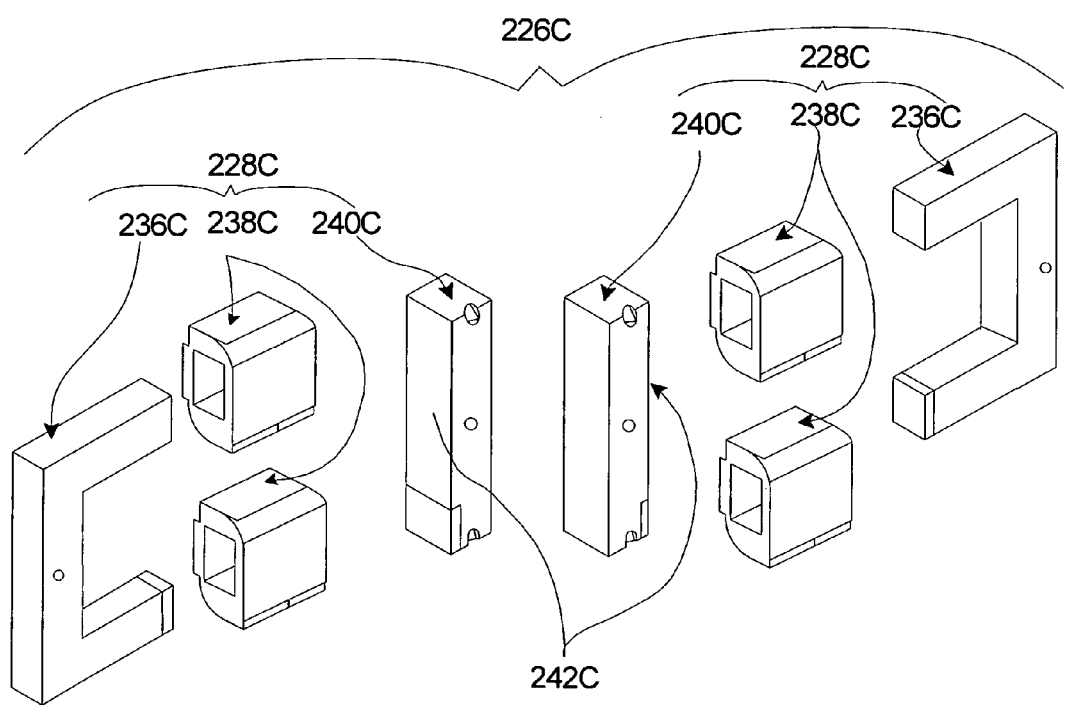
FIG. 3B is a perspective view of an C/I core actuator pair having features of the present invention.

FIG. 3B illustrates a perspective view of an alternative embodiment of an attraction-only actuator pair 226C, also referred to herein as a C/I core actuator pair. In this embodiment, one or more C/I core actuator pairs 226C can be utilized instead of or in addition to the E/I core actuator pair(s) 226 (illustrated in FIG. 3A). The C/I core actuator pair 226C includes two C/I core electromagnetic actuators 228C. Each C/I core actuator 228C can include a C shaped core 236C, two tubular shaped conductors 238C, and an I shaped core 240C. The combination of the C core 236C and the conductor 238C can be referred to herein as an electromagnet, while the I core 240C can be referred to herein as a target. Each target 240C includes a target surface 242C that generally faces the corresponding C core 236C.

Figure 4A:
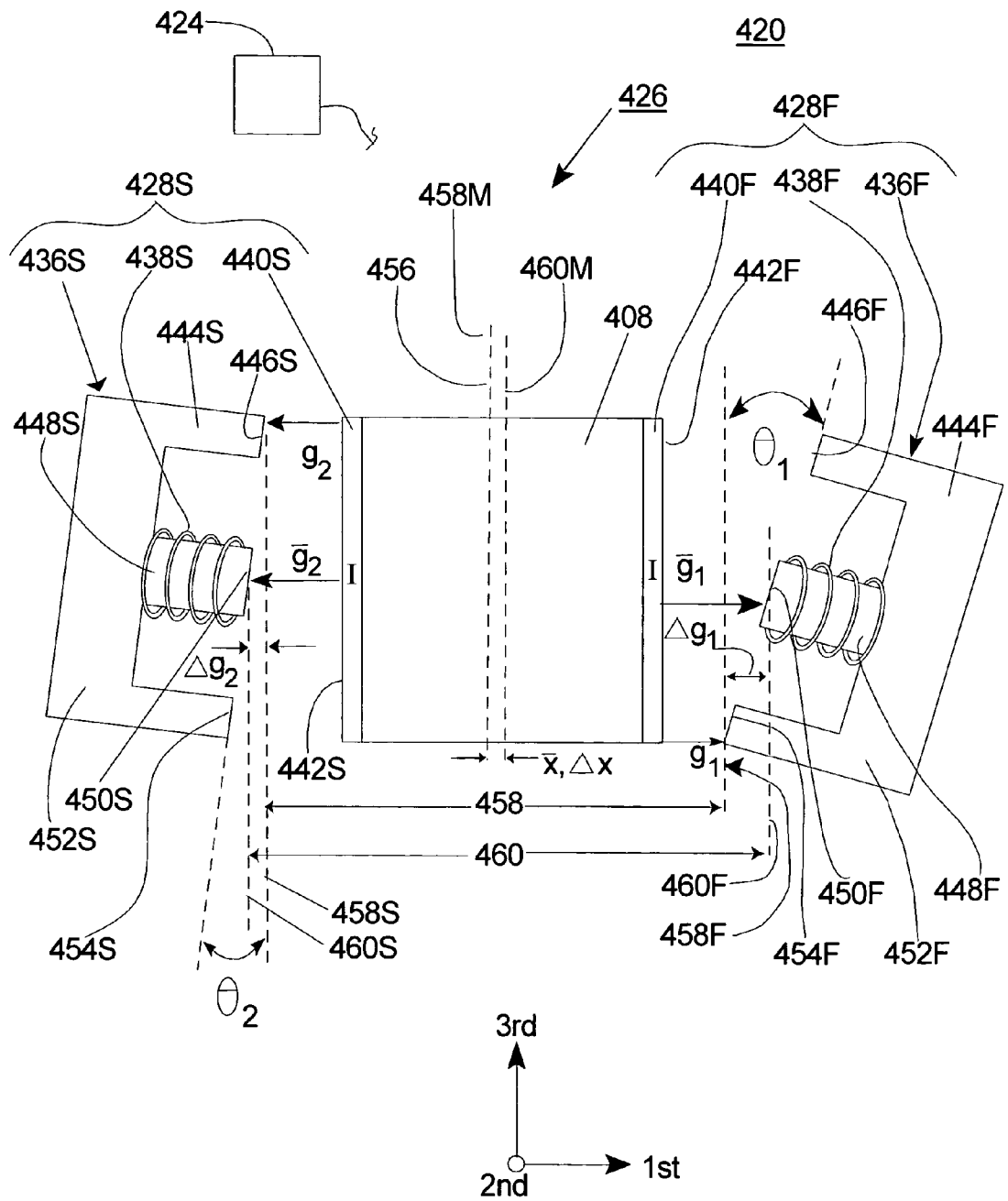
FIG. 4A is a schematic view of a portion of a stage assembly including a stage positioned at a physical range midpoint and an actuator pair having features of the present invention.

FIG. 4A is a simplified side view of a portion of an embodiment of the stage assembly 420, including an E/I core actuator pair 426, a control system 424, and a portion of the stage 408. In the embodiment illustrated in FIG. 4A, the E/I core actuator pair 426 includes a first actuator 428F and a second actuator 428S. The first actuator 428F includes a first electromagnet 436F, a first conductor 438F, and a first target 440F having a first target surface 442F, and the second actuator 428S includes a second electromagnet 436S, a second conductor 438S, and a second target 440S having a second target surface 442S.

The first electromagnet 436F includes a first upper arm 444F having a first upper end region 446F, a first middle arm 448F having a first middle end region 450F, and a first lower arm 452F having a first lower end region 454F. The second electromagnet 436S includes a second upper arm 444S having a second upper end region 446S, a second middle arm 448S having a second middle end region 450S and a second lower arm 452S having a second lower end region 454S. Because the orientation of the electromagnets 436F, 436S can vary, the terms "first" and "second" are interchangeable and are for convenience of discussion only, as are the terms "upper" and "lower". In this embodiment, the targets 440F, 440S are secured to the stage 408. A centerline of the stage 408 is also indicated in FIG. 4A as dashed line 456.

The stage 408 has a stage physical range 458 and a force functional range 460. The stage physical range 458 defines the limitations of movement of the portion of the stage 408 and the targets 440F, 440S that are secured to the stage 408. The stage physical range 458 has a first physical range end 458F, a second physical range end 458S and a physical range midpoint 458M. In this embodiment, the first physical range end 458F is positioned at the first lower end region 454F of the first electromagnet 436F, and is closer to the first target surface 442F than to the second target surface 442S. Somewhat similarly, the second physical range end 458S is positioned at the second upper end region 446S of the second electromagnet 436S, and is closer to the second target surface 442S than to the first target surface 442F. The physical range midpoint 458M is located at the center of the stage physical range 458. The distance between the physical range midpoint 458M and the centerline 456 of the stage 408 at any given time $t_1, t_2, t_3 \ldots t_n$ is referred to herein as "x". In FIG. 4A, the centerline 456 of the stage 408 is substantially the same as the physical range midpoint 458M. Therefore, in the example illustrated in FIG. 4A, x=0.

In FIG. 4A, the distance between the first lower end region 454F and the first target surface 442F is referred to as the first physical gap $g_1$. Somewhat similarly, the distance between the second upper end region 446S and the second target surface 442S is referred to as the second physical gap $g_2$. Additionally, in FIG. 4A, the stage 408 is at an initial position, the centerline 456 of the stage 408 is centered at the physical range midpoint 458M, and the first physical gap $g_1$ is substantially equal to the second physical gap $g_2$. Thus, $$g_1 = g_2 = g_0 \qquad (1)$$

where $g_0$ is the nominal operating E/I gap which is equal to (i) the initial gap distance between the first target surface 442F and the first physical range end 458F, and (ii) the initial gap distance between the second target surface 442S and the second physical range end 458S, when the stage 408 is at the initial position.

Alternatively, the first physical gap $g_1$ and the second physical gap $g_2$ could be defined by a distance between another portion of each of the electromagnets 436F, 436S and the corresponding targets 440F, 440S.

The control system 424 directs current to the E/I core actuator pair 426 to position the targets 440F, 440S, and thus the stage 408, within the stage physical range 458. In the embodiment illustrated in FIG. 4A, for example, the stage 408 and the targets 440F, 440S can basically move between the first lower end region 454F and the second upper end region 446S without a collision occurring between one of the target surfaces 442F, 442S and one of the electromagnets 436F, 436S. The control system 424 independently directs D.C. electric current to each of the actuators 428F, 428S with a variable current first current source that directs a first current $I_1$ to the first conductor 438F and a variable current second current source that directs a second current $I_2$ to the second conductor 438S.

In the embodiment illustrated in FIG. 4A, the first current $I_1$ directed through the first conductor 438F generates an electromagnetic field that attracts the first target 440F towards the first electromagnet 436F and results in an attractive first force $F_1$ across the first physical gap $g_1$ and the second current $I_2$ directed through the second conductor 438S generates an electromagnetic field that attracts the second target 440S towards the second electromagnet 436S and results in an attractive second force $F_2$ across the second physical gap $g_2$. The amount of current determines the amount of attraction. With this design, the first actuator 428F urges the stage 408 with a controlled first force $F_1$ in one direction (to the right along the first axis), and the second actuator 428S urges the stage 408 with a controlled second force $F_2$ in the opposite direction (to the left along the first axis). Assuming precise parallel alignment between the electromagnets 436F, 436S and the corresponding target surfaces 442F, 442S, the net force $\Delta F$ is equal to the difference between the first force $F_1$ and the second force $F_2$.

$$\text{Thus, } F_1 - F_2 = \Delta F. \qquad (2)$$

$F_1$ and $F_2$ are positive or zero, while the $\Delta F$ can be positive, zero, or negative.

Theoretically, when the first force $F_1$ is equal to the second force $F_2$, the net force $\Delta F$ generated by the E/I core actuator pair 426 on the stage 408 should equal zero and there would be no acceleration of the stage 408. However, (i) when the first force $F_1$ is greater than the second force $F_2$, the net force $\Delta F$ is positive and the E/I core actuator pair 426 moves the stage 408 to the right along the first axis and (ii) when the second force $F_2$ is greater than the first force $F_1$, the net force $\Delta F$ is negative and the E/I core actuator pair 426 moves the stage 408 to the left along the first axis. Stated another way, the E/I core actuator pair 426 can be used to move and position the stage 408 left and right along the first axis under the influence of the two actuators 428F, 428S. Additional E/I core actuator pairs (illustrated in FIG. 2) can be used to position the stage 408 with up to six degrees of freedom.

The amount of movement is determined by the magnitudes of force $F_1$ and $F_2$ which in turn, are each a function of the amount of current $I_1$, $I_2$ directed to each of the conductors 438F, 438S and the size of the physical gaps $g_1$, $g_2$. There is a linear relationship between the net force $\Delta F$ applied to stage 408 and the acceleration of stage 408. Consequently, if a large acceleration is desired, a large net force $\Delta F$ must be applied. To apply a large net force $\Delta F$, the first force $F_1$ must be much larger or much smaller than second force $F_2$.

The specific range of movement of the stage 408 can depend upon the positioning of the electromagnets relative to the targets 440F, 440S. Stated another way, movement of the stage 408 between the electromagnets 436F, 436S is at least partially determined by the positioning and/or angle of the arms 444F, 448F, 452F, 444S, 448S, 452S of the electromagnets 436F, 436S relative to their corresponding target 440F, 440S, as described in greater detail below.

The force functional range 460 is the distance directly between the middle arms 448F, 448S of the electromagnets 436F, 436S of the E/I core actuator pair 426. The force functional range 460 is determined by the location of the middle arms 448F, 448S of the electromagnets 436F, 436S because the electromagnetic force that attracts the target 440F, 440S toward the electromagnet 436F, 436S substantially emanates from the middle arm 448F, 448S and the conductor 438F, 438S of each electromagnet 436F, 436S.

The force functional range 460 has a first functional range end 460F, a second functional range end 460S and a functional range midpoint 460M which is located at the center of the force functional range 460. The functional range midpoint 460M varies depending upon the extent of any lack of parallelism between the electromagnets 436F, 436S and the corresponding target surfaces 442F, 442S of the E/I core actuator pair 426. The distance between the functional range midpoint 460M and the centerline 456 of the stage 408 is referred to herein as $\bar{x}$. In FIG. 4A, the functional range midpoint 460M is offset from the physical range midpoint 458M by a value of $\Delta x$. Stated another way, $$\bar{x} = x - \Delta x. \qquad (3)$$

Further, the gap distance between the first target surface 442F and the middle end region 450F of the first middle arm 448F is referred to herein as a first functional gap $\bar{g}_1$. Somewhat similarly, the gap distance between the second target surface 442S and the middle end region 450S of the second middle arm 448S is referred to herein as a second functional gap $\bar{g}_2$. Alternatively, the first functional gap $\bar{g}_1$ and/or the second functional gap $\bar{g}_2$ can be defined by the distance between another portion of the electromagnets 436F, 436S and the corresponding targets 440F, 440S.

The force functional range 460 can be determined by measurement. For example, one or more sensors 223 (illustrated in FIG. 3A) can be positioned at various locations on one or more of the electromagnets 436F, 436S and the targets 440F, 440S. The information from the sensors can be used to determine the first functional gap $\bar{g}_1$ and/or the second functional gap $\bar{g}_2$. From this data, along with the known dimensions of the targets 440F, 440S and the stage 408, the force functional range 460 can be determined. Alternatively, the force functional range can be determined by other methods, such as by using shims to measure the gap distance between a portion of one or more of the electromagnets 436F, 436S and a portion of one or more of the targets 440F, 440S. Still alternatively, any other suitable method of measuring the force functional range can be utilized.

The difference between the first functional gap $\bar{g}_1$ and the first physical gap $g_1$ is referred to as the first gap error $\Delta g_1$. The difference between the second functional gap $\bar{g}_2$ and the second physical gap $g_2$ is referred to as the second gap error $\Delta g_2$.

Thus, $g_1 = \bar{g}_1 - \Delta g_1$, (4)

and $g_2 = \bar{g}_2 - \Delta g_2$. (5)

Ideally, the force functional range 460 is the same as the stage physical range 458, which would be indicative of precise manufacturing and exact parallelism of the electromagnets 436F, 436S relative to the corresponding target surfaces 442F, 442S. However, any deviation during manufacturing or a lack of parallelism of the electromagnets 436F, 436S relative to the target surfaces 442F, 442S during operation can exist. Any such ill-parallelism of the E/I core actuator pair 426 which occurs during manufacturing or operation of the precision assembly 10 results in a disparity between the force functional range 460 and the stage physical range 458. More specifically, the force functional range 460 is greater than the stage physical range 458 and/or the force functional range 460 is somewhat offset, e.g., slightly toward or away from the first electromagnet 436F, from the stage physical range 458. Consequently, any ill-parallelism between one or more of the electromagnets 436F, 436S and one or more of the target surfaces 442F, 442S can cause a disparity between a desired net force $\Delta F_D$ and an actual net force $\Delta F_A$. Stated another way, from the perspective of the control system 424, current is being directed to the conductors 438F, 438S as though the range of movement of the targets 440F, 440S and the stage 408 were within the force functional range 460. However, in actuality, the range of movement of the targets 440F, 440S and the stage 408 is physically limited to the stage physical range 458. The control system 424 provided herein takes this disparity into account before and/or during movement of the stage 408.

For example, if the stage 408 is positioned at the physical range midpoint 458M, and equal current is directed to the first conductor 438F and the second conductor 438S, equal forces should be imparted on the stage 408 by the actuators 428F, 428S because $g_1 = \bar{g}_1 = g_2 = \bar{g}_2$. Assuming precise parallelism between the electromagnets 436F, 436S and the corresponding target surfaces 442F, 442S, the stage 408 should remain stationary. However, any lack of precise parallelism can result in $\bar{g}_1$ being greater or less than $\bar{g}_2$, which can indicate that the stage physical range 458 differs from the force functional range 460. The extent of this disparity can vary from one E/I core actuator pair 426 to another, and can vary over time.

Because the force functional range 460 can be larger than the stage physical range 458, if the stage assembly 420 did not take into account the lack of parallelism of each electromagnet 436F, 436S relative to the corresponding target surface 442F, 442S, the control system 424 could impose electromagnetic forces on the stage 408 resulting in an increased following error $x_{err}$ of the stage 408 (explained in greater detail below) and/or a collision between one of the targets 440F, 440S and the corresponding electromagnet 436F, 436S. Stated another way, absent the calibration capabilities of the present invention as described herein, the control system 424 may not recognize that the stage physical range 458 can be smaller than the force functional range 460, which could cause damage to the stage assembly 420 and/or manufacturing of semiconductor wafers of a decreased quality.

As illustrated in FIG. 4A, the end regions 446F, 450F, 454F of the first electromagnet 436F may temporarily or permanently be spaced apart from the first target surface 442F to different extents. The disparity in distance between different end regions 446F, 450F, 454F of the first electromagnet 436F and the first target surface 442F results in the first electromagnet 436F being positioned at a first angle $\theta_1$ having an absolute value of greater than zero degrees relative to the first target surface 442F.

The first angle $\theta_1$ can be measured from a line formed by any two measurement points on the first electromagnet 436F, in relation to the first target surface 442F. Somewhat similarly, the second angle $\theta_2$ can be measured from a line formed by any two measurement points on the second electromagnet 436S, in relation to the second target surface 442S. For example, with respect to the first angle $\theta_1$, a first measurement point can be located on the first lower end region 454F, and the second measurement point can be located on the first middle end region 450F. Alternatively, the first measurement point can be located on the first lower end region 454F and the second measurement point can be located on the first upper end region 446F. Still alternatively, the measurement points can be located elsewhere on the first electromagnet 436F or the first conductor 438F, provided the line formed by the measurement points forms a theoretical first angle $\theta_1$ with the first target surface 440F.

The second angle $\theta_2$ can utilize similar measurement points located on the second electromagnet 436S, which define a line that forms the second angle $\theta_2$ with the second target surface 442S.

In the example illustrated in FIG. 4A, the end regions 446S, 450S, 454S of the second electromagnet 436S are spaced apart from the second target surface 442S to different extents. The disparity in distance between different end regions 446S, 450S, 454S of the second electromagnet 436S and the second target surface 442S results in the second electromagnet 436S being positioned at a second angle $\theta_2$ having an absolute value of greater than zero degrees relative to the second target surface 442S.

In the embodiment illustrated in FIG. 4A, the angle $\theta_1$, $\theta_2$ between each electromagnet 436F, 436S and the target surface 442F, 442S of the corresponding target 440F, 440S has been greatly exaggerated for illustrative purposes. More typically, the angle between the electromagnet 436F, 436S and the target surface 442F, 442S is less than approximately 0.05 degrees, although the angle can be greater than this amount. Alternatively, only one of the angles $\theta_1$, $\theta_2$ has an absolute value of greater than zero degrees.

The first angle $\theta_1$ and the second angle $\theta_2$ for each E/I core actuator pair 426 can vary during operation of the precision assembly 10. Moreover, at a given time, the first angle $\theta_1$ can differ from the second angle $\theta_2$ or the angles $\theta_1$, $\theta_2$ can be the same. The control system 424 as provided herein can accurately calibrate and/or account for these angles $\theta_1$, $\theta_2$ at various times by varying the current that is directed to the conductors 438F, 438S. With this design, the control system 424 inhibits potential collisions between one or more of the electromagnets 436F, 436S and one or more of the targets 440F, 440S which could otherwise damage the stage assembly 420 and/or produce semiconductor wafers of a decreased quality.

Theoretically, as provided herein, the desired force output $F_1$ for the first actuator 428F can be expressed as follows:

$$F_1 = k(I_1^2)/(g_1+a)(g_1+b) \quad (6)$$

Similarly, the desired output force $F_2$ generated by the second actuator 428S can be expressed as follows:

$$F_2 = k(I_2^2)/(g_2+a)(g_2+b) \quad (7)$$

In one embodiment, k is an E/I force constant wherein $k = \frac{1}{2}N^2\mu_o wd$; where N=the number of coil turns in the conductor; $\mu_o$=a physical constant of about $1.26 \times 10^{-6}$ H/m; w=the half width of the center of the E core, in meters; and d=the depth of the center of the E core, in meters. For example, in one embodiment, $k = 7.73 \times 10^{-6}$ kg m$^3$/s$^2$A$^2$; the terms a and b for each actuator are determined by experimental testing of the assembled actuator pair and are related to the shape and alignment of the electromagnets 436F, 436S and the targets 440F, 440S; and where either the measured physical gaps $g_1$, $g_2$ or equivalently the parameters (a and b) are modified to match the force output $F_1$, $F_2$.

The commutation formula which transforms the desired forces $F_1$, $F_2$ to the required currents $I_1$, $I_2$ to be directed to each conductor is therefore:

$$I_{1,2} = \sqrt{\frac{(g_{1,2}+a)(g_{1,2}+b)}{(g_o+a)(g_o+b)} \frac{F_{1,2}}{k}} \quad (8)$$

where $g_o$ is the nominal operating E/I gap which is equal to (i) the initial gap distance between the first target surface 442F and the first physical range end 458F, and (ii) the initial gap distance between the second target surface 442S and the second physical range end 458S, when the stage 408 is at the initial position.

Figure 4B:
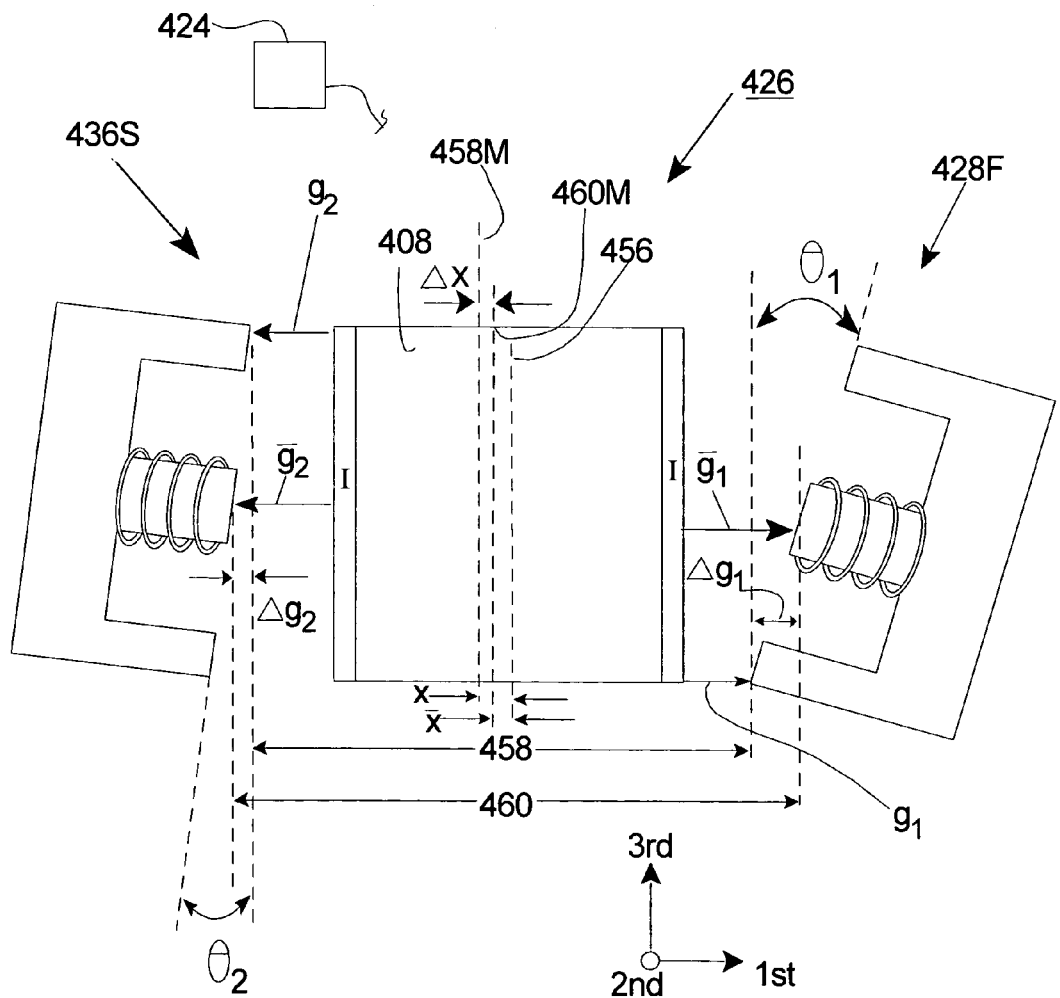
FIG. 4B is a schematic view of the stage assembly illustrated in FIG. 4A including the stage positioned off-center from the physical range midpoint.

FIG. 4B illustrates the portion of the stage assembly 420 shown in FIG. 4A, wherein the first actuator 428F and the second actuator 428S of the E/I core actuator pair 426 have moved the stage 408 so that the centerline 456 of the stage 408 is a distance equal to x to the right of the physical range midpoint 458M. At this time, $$g_1 = g_0 - x, \quad (9)$$

and $g_2 = g_0 + x$. (10)

In a first embodiment of the present invention, the control system 424 calibrates the functional range midpoint 460M according to a first calibration algorithm, which is based on the physical range midpoint 458M. Stated another way, the control system 424 calibrates the physical gaps $g_1$ and $g_2$ relative to the force functional range 460 of the stage 408. In this embodiment, $(g_{1,2} = g_o \mp x)$ can be calibrated by replacing the distance between the physical range midpoint 458M and the centerline 456 of the stage 408, x, with the distance between the functional range midpoint 460M and the centerline 456 of the stage 408, $\bar{x}$, so that $$g_{1,2} = g_o \mp \bar{x}. \quad (11)$$

Further, because $\bar{x} = x - \Delta x$, (12)

$$g_{1,2} = g_o \mp (x - \Delta x). \quad (13)$$

By adding the same force profile simultaneously to both actuators 428F, 428S of the E/I core actuator pair 426, the fine adjustment term $\Delta x$ is adapted to reduce the position following error $x_{err}$ as follows.

$$\Delta x(t) = \Delta x(t-1) + \lambda x_{err}(t) \quad (14)$$

where $\lambda$ is the adaptation gain. Alternatively, the fine adjustment term $\Delta x$ is adapted to reduce the feedback control force F as follows:

$$\Delta x(t) = \Delta x(t-1) + \lambda F(t). \quad (15)$$

where $\lambda$ is the adaptation gain.

Figure 5A:
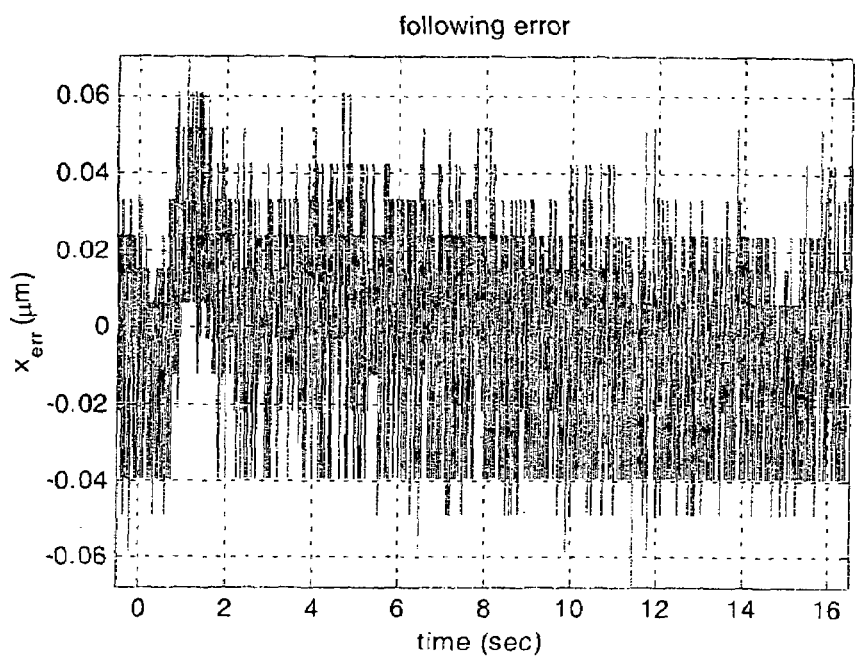
FIG. 5A is a graph plotting experimental results of following error as a function of time in a first embodiment of the present invention.

FIG. 5A is a graph of experimental results that plots following error $x_{err}$ versus time using the stage assembly 420 in FIG. 4A, including the control system 424 provided herein. In this example, a lack of parallelism is present between the electromagnets 436F, 436S and the corresponding target surfaces 442F, 442S. Further, the centerline 456 of the stage 408 is servoed at the physical range midpoint 458M. A force profile similar to FIG. 5B having a maximal magnitude of 54N is added into the command force of each actuator 428F, 428S of the stage assembly 420. Absent use of one or more of the calibration algorithms provided herein, the actual forces imposed on the stage $F_{A1}$, $F_{A2}$ would likely differ because the functional range midpoint 460M is different than the physical range midpoint 458M. Thus, without taking into account the lack of parallelism, a non-zero net force on the stage 408 would likely occur, resulting in net movement of the stage 408. Stated another way, because the stage 408 would likely move when it should remain stationary, a significant following error $x_{err}$ occurs.

In contrast, FIG. 5A illustrates a reduced following error $x_{err}$ of the stage 408 utilizing the control system 424 provided herein, regardless of any lack of parallelism during operation. In the stage assembly 420 which uses the first calibration algorithm described previously, the following error $x_{err}$ can be greatly reduced. In this example, the following error $x_{err}$ can be on the order of between zero and 0.06 μm or less. In fact, the following error $x_{err}$ illustrated in FIG. 5A is typically consistently between approximately zero and 0.02 μm.

By comparison, without using the first calibration algorithm, the following error $x_{err}$ can be approximately 50–100 times greater than when using the first calibration algorithm. For example, the following error $x_{err}$ can be on the order of ±1.0 to 7.0 μm or more when not using one or more of the calibration algorithms provided herein. Moreover, without using the first calibration algorithm, the following error $x_{err}$ tends to increase as a greater force is applied, e.g. 54N, or decrease as a lesser force is applied.

Figure 5B:
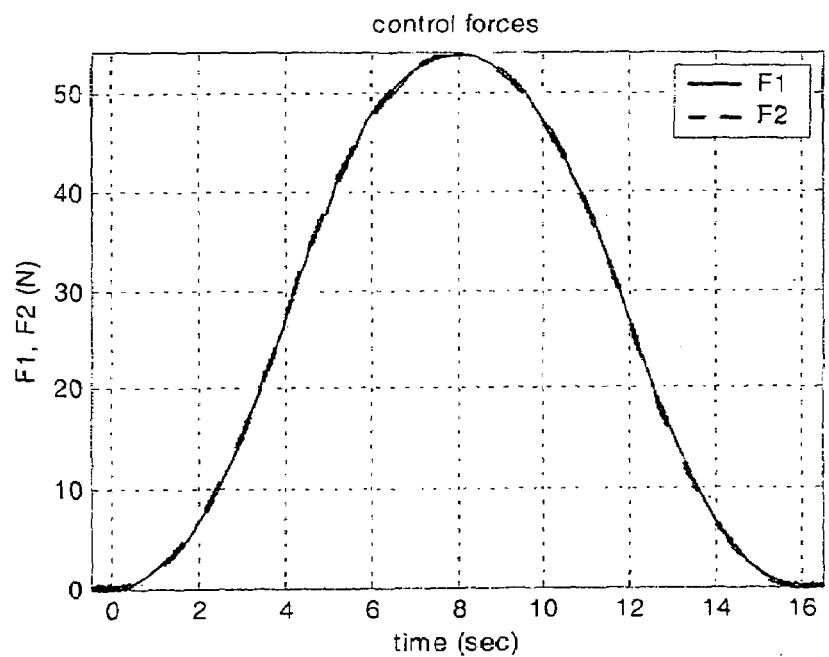
FIG. 5B is a graph plotting experimental results of control forces as a function of time in a first embodiment of the present invention.

FIG. 5B is a graph that plots the control force of each actuator 428F, 428S in the E/I core actuator pair 426 versus time during the same experiment provided in FIG. 5A. FIG. 5B illustrates that even with a lack of parallelism between the electromagnets 436F, 436S and the corresponding target surfaces 442F, 442S, the control forces $F_1$, $F_2$ for each of the actuators 428F, 428S in the E/I core actuator pair 426 are substantially the same due to the calibration by the control system 424 provided herein. In this example, the plot for control force $F_1$ is substantially similar to the plot for control force $F_2$.

Figure 5C:
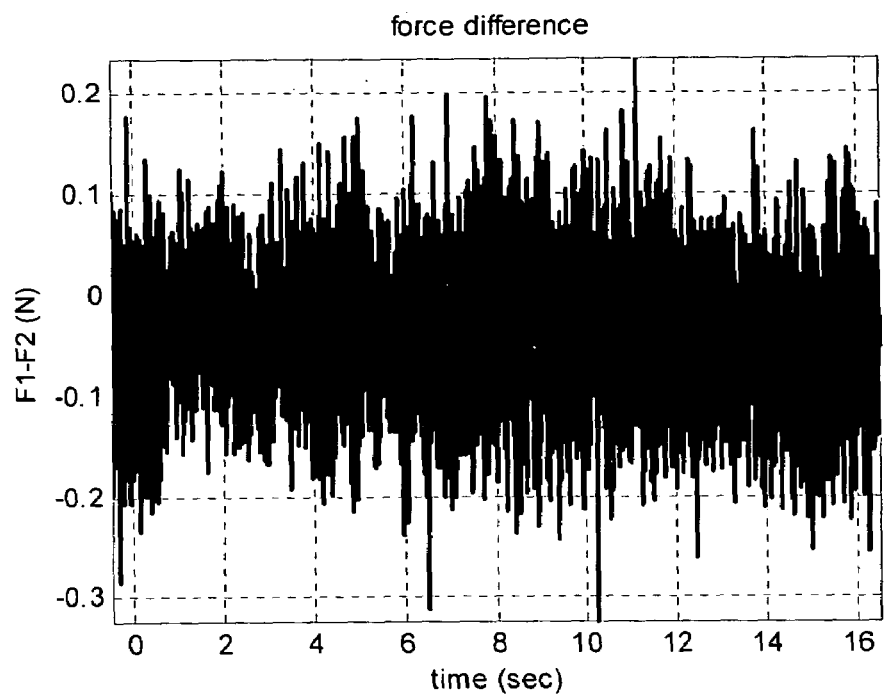
FIG. 5C is a graph plotting experimental results of force difference as a function of time in a first embodiment of the present invention.

FIG. 5C is a graph that plots force difference versus time between the forces applied to each of the two actuators 428F, 428S during the experiment described relative to FIG. 5A. FIG. 5C further illustrates a reduced disparity between the control forces $F_1$, $F_2$ for each of the actuators in the E/I core actuator pair 426 utilizing the control system 424 provided herein. In this example, the disparity is generally within the range of zero N and approximately ±0.2N during force injection. The stage position target is fixed during force injection; no acceleration or deceleration trajectory is applied.

In contrast, without calibrating the force functional range 460 with the stage physical range 458, a substantial difference in control forces would occur, resulting in a relatively large following error $x_{err}$. In fact, without utilizing the control system which uses the first calibration algorithm described herein, a disparity of up to or greater than 8N can occur under similar testing circumstances. Further, the disparity increases or decreases depending upon the extent of the force applied to the stage 408. In this example, without taking into account the positioning, including the angle, of each electromagnet 436F, 436S relative to each corresponding target surface 442F, 442S, a different control force can occur for each actuator 428F, 428S in the E/I core actuator pair 426, leading to greater following errors $x_{err}$.

Figure 5D:
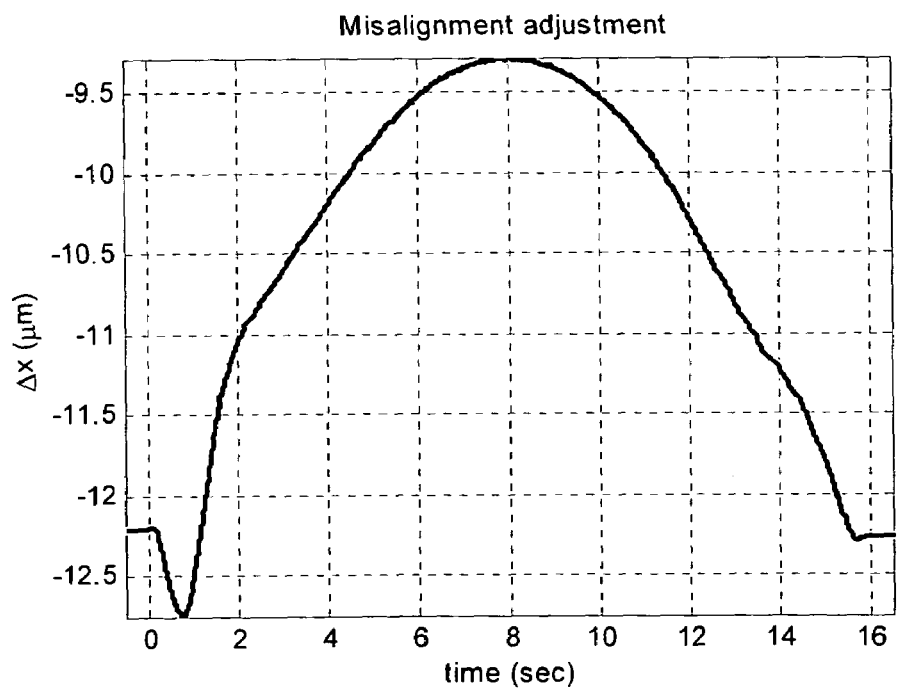
FIG. 5D is a graph plotting experimental results of misalignment adjustment as a function of time in a first embodiment of the present invention.

FIG. 5D is a graph that plots misalignment adjustment $\Delta x$ versus time during the experiment described above relative to FIG. 5A. FIG. 5D illustrates that the extent of adjustment during calibration is not a constant, but actually changes depending upon the injected force over time. This implies that the gap errors $\Delta g_1$, $\Delta g_2$ change depending upon the applied force. As a consequence, use of the control system 424 described herein is particularly useful during operation because of the continually changing position of the electromagnets 436F, 436S relative to the target surfaces 442F, 442S during the force injection.

Because the gap errors $\Delta g_1$, $\Delta g_2$ can change during operation of the precision assembly 10 due to the forces imposed upon the actuators 428F, 428S, each gap error $\Delta g_1$, $\Delta g_2$ can be periodically or continually monitored and/or calibrated during operation. For example, the gap error calibration algorithm at equation (17) can be further described in the following form which can be used to determine each gap error $\Delta g_1$, $\Delta g_2$ at time t during operation of the precision assembly:

$$\Delta g_{1,2}(t) = g_{1,2}(t-1) + \lambda x_{err}(t) \frac{2(g_{1,2}(t-1) - \Delta g_{1,2}(t-1)) + a + b}{(g_{1,2}(t-1) - \Delta g_{1,2}(t-1) + a)^2 (g_{1,2}(t-1) - \Delta g_{1,2}(t-1) + b)^2} k I_{1,2}^2(t-1) \quad (21)$$

In a second embodiment of the present invention, the control system 424 calibrates and corrects gap errors $\Delta g_1$, $\Delta g_2$ due to a lack of parallelism according to a second calibration algorithm. In this embodiment, the gaps ($g_1$, $_2 = g_o \mp x$) can be calibrated by adding individual gap error $\Delta g_1$, $\Delta g_2$ adjustment terms such that:

$$g_{1,2} = g_o \mp x - \Delta g_{1,2} \quad (16)$$

to account for any lack of parallelism of the actuators 428F, 428S. The position following error $x_{err}$ can be maintained at a very small magnitude by an initial, a periodic or a continuous adaptation, e.g. by calculation of the gap errors $\Delta g_1$, $\Delta g_2$ in the E/I core commutation. Consequently, the resulting calculated gap errors $\Delta g_{1,2}$ will be very close to the actual gap errors of $\Delta g_1$, $\Delta g_2$. In one embodiment, a gradient method can be used for this type of adaptive control, as provided in the following gap error calibration algorithm:

$$\Delta g_{1,2}(t) = \Delta g_{1,2}(t-1) + \lambda x_{err}(t) \frac{\partial x_{err}(t-1)}{\partial g_{1,2}(t-1)} \quad (17)$$

where $\lambda$ is the adaptation gain.

The following error is expressed as:

$$x_{err}(s) = G_{plant}(s)(F_2 - F_1) \quad (18)$$

and is proportional to the force difference of both actuators 428F, 428S, i.e. $x_{err}(t) \propto F_2 - F_1$. Accordingly, $$\frac{\partial x_{err}(t-1)}{\partial g_{1,2}(t-1)} = \frac{\partial x_{err}(t-1)}{\partial F_{1,2}} \frac{\partial F_{1,2}}{\partial g_{1,2}}. \quad (19)$$

Without loss of generality, the term $$\frac{\partial x_{err}(t-1)}{\partial F_{1,2}}$$

can merge into the adaptation parameter $\lambda$. With the partial differentiations of force with respect to gap, In one embodiment, equation (21) is utilized to continually calculate $\Delta g_1$ and $\Delta g_2$ with the initial condition of $\Delta g_{1,2}(0) = 0$.

Figure 6A:
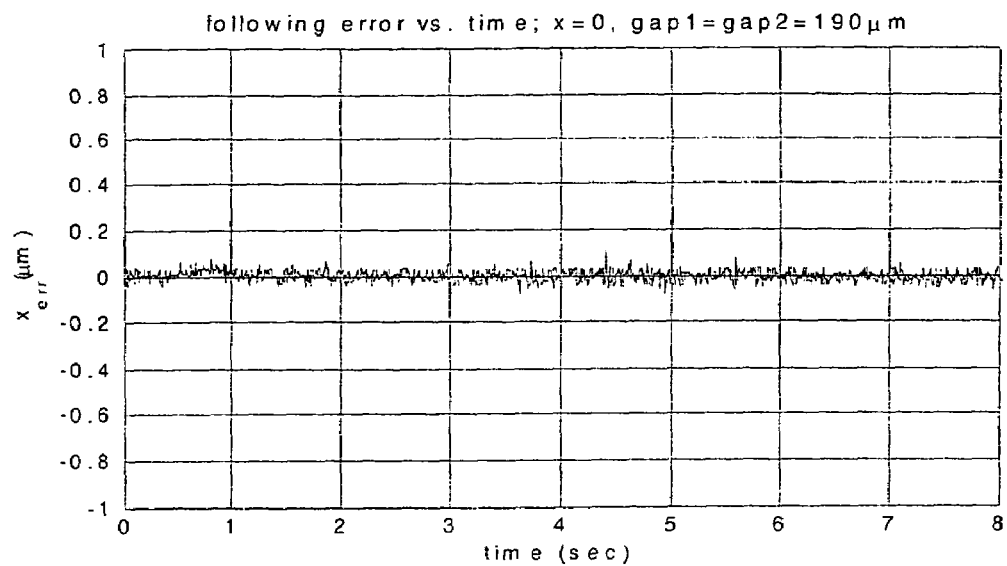
FIG. 6A is a graph plotting experimental results of following error as a function of time in a second embodiment of the present invention including the stage in a first position.

FIG. 6A is a graph that plots experimental results of following error $x_{err}$ versus time utilizing the stage assembly 420 (illustrated in FIG. 4A) having a control system 424 that uses the second calibration algorithm provided herein. In this example, an injected force with a maximum magnitude of 54N is applied to each of the two actuators 428F, 428S in the E/I core actuator pair 426. The force profile is a bell-shaped curve that is substantially similar to the curve previously illustrated in FIG. 5B. In FIG. 6A, $g_1 = g_2 = 190$ µm. Further, in FIG. 6A, the centerline 456 of the stage 408 is positioned at the physical range midpoint 458M, e.g., x=0. FIG. 6A shows that the following error $x_{err}$ is relatively small, e.g. less than 0.1 µm, and remains substantially consistent over time, despite changes in acceleration and/or deceleration of the stage 408.

Figure 6B:
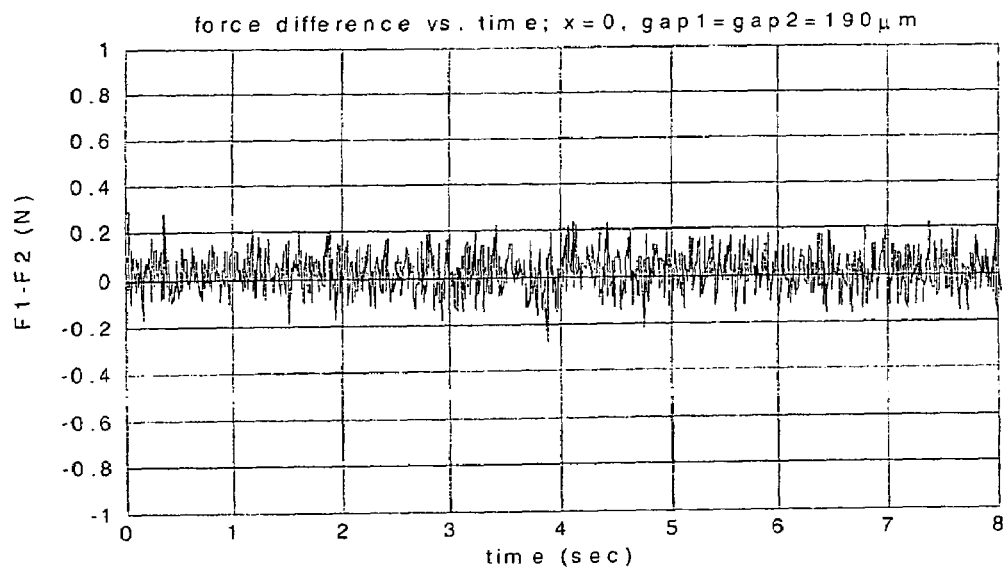
FIG. 6B is a graph plotting experimental results of force difference as a function of time in a second embodiment of the present invention including the stage in a first position.

FIG. 6B is a graph that plots force difference versus time between the forces applied to each of the two actuators during the experiment described relative to FIG. 6A. FIG. 6B further illustrates a reduced disparity between the control forces $F_1$, $F_2$ for each of the actuators 428F, 428S in the E/I core actuator pair 426 utilizing the control system 424 provided herein. In this example, the disparity is generally within the range of zero N and approximately ±0.2N during both the acceleration and deceleration of the stage 408 over time.

Figure 6C:
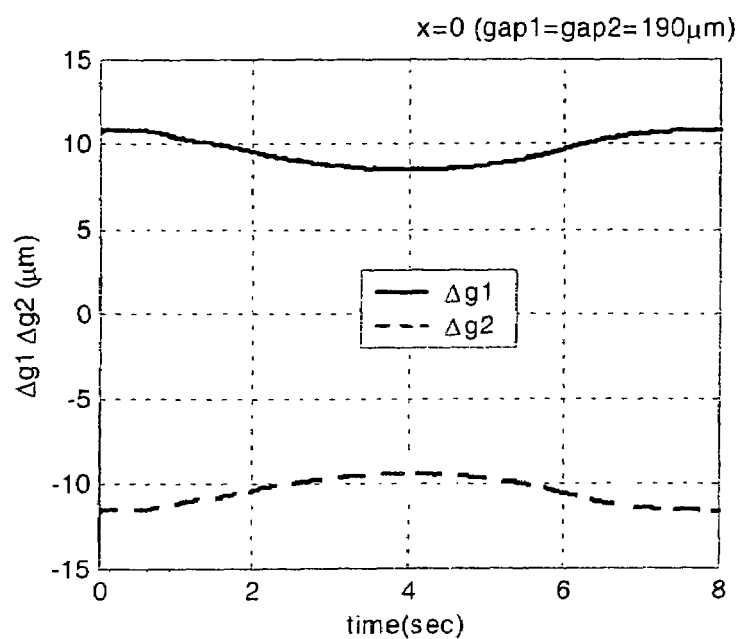
FIG. 6C is a graph plotting experimental results of the change in gap distance as a function of time in a second embodiment of the present invention.

FIG. 6C is a graph that plots the gap errors $\Delta g_1$, $\Delta g_2$ as a function of time during the experiment described previously relative to FIG. 6A. FIG. 6C illustrates that the gap errors $\Delta g_1$, $\Delta g_2$ change depending upon the extent of the applied force to the actuators 428F, 428S, which further justifies the need for the control system 424 which utilizes one or more of the calibration algorithms during operation of the precision assembly 10.

Figure 6D:
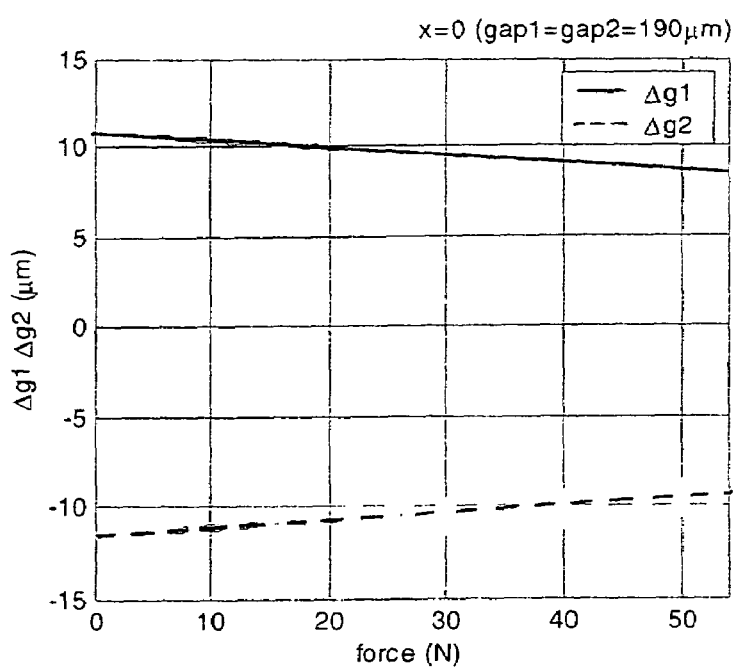
FIG. 6D is a graph plotting experimental results of the change in gap distance as a function of force in a second embodiment of the present invention.

FIG. 6D is a graph that plots the gap errors $\Delta g_1$, $\Delta g_2$ as a function of applied force to the actuators 428F, 428S. FIG. 6D illustrates that as the applied force changes, the gap errors $\Delta g_1$, $\Delta g_2$ also change, further justifying the need for $$\frac{\partial F_{1,2}}{\partial g_{1,2}} = \frac{2(g_{1,2}(t-1) - \Delta g_{1,2}(t-1)) + a + b}{(g_{1,2}(t-1) - \Delta g_{1,2}(t-1) + a)^2 (g_{1,2}(t-1) - \Delta g_{1,2}(t-1) + b)^2} k I_{1,2}^2(t-1). \quad (20)$$

the control system 424 which utilizes one or more of the calibration algorithms during operation of the precision assembly 10.

Figure 7A:
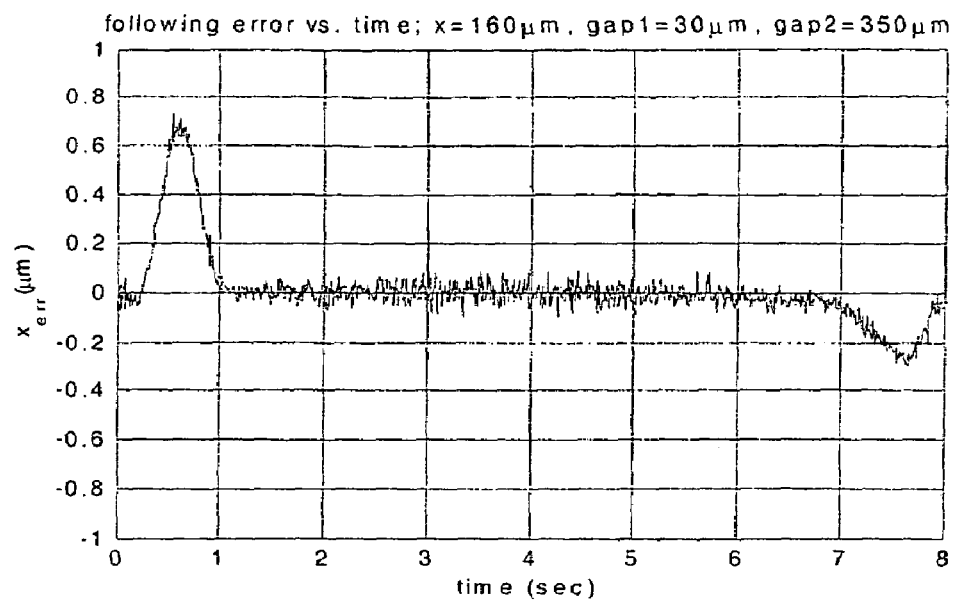
FIG. 7A is a graph plotting experimental results of following error as a function of time in a second embodiment of the present invention including the stage in a second position.

FIG. 7A is another graph that plots experimental results of following error $x_{err}$ versus time utilizing the stage assembly 420 (illustrated in FIG. 4A) having a control system 424 that uses the second calibration algorithm provided herein. In this example, an injected force with a maximum magnitude of 54N is applied to each of the two actuators 428F, 428S in the E/I core actuator pair 426. The force profile is a bell-shaped curve that is substantially similar to the curve previously illustrated in FIG. 5B. In FIG. 7A, $g_1$=30 μm, $g_2$=350 μm and x=160 μm. In other words, the centerline 456 of the stage 408 is positioned 160 μm from the physical range midpoint 458M, i.e. toward the first electromagnet 436F. FIG. 7A shows that for a majority of the experiment, the following error $x_{err}$ is relatively small, e.g., within the range of zero to 0.1 μm, and remains substantially consistent over time, despite changes in the applied force, particularly between t=1 and t=7.

Figure 7B:
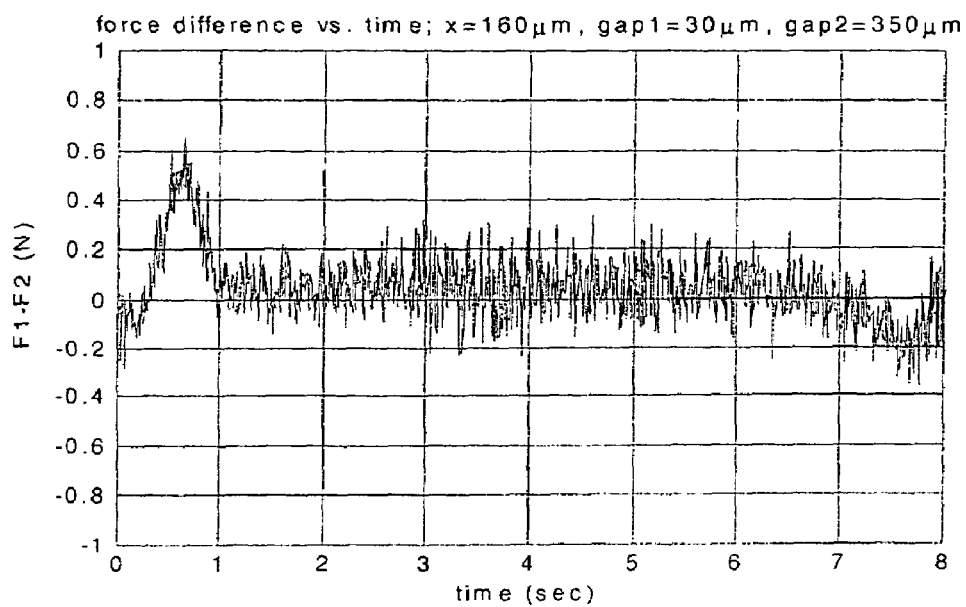
FIG. 7B is a graph plotting experimental results of force difference as a function of time in a second embodiment of the present invention including the stage in a second position.

FIG. 7B is a graph that plots force difference versus time between the forces applied to each of the two actuators 428F, 428S during the experiment described relative to FIG. 7A. FIG. 7B further illustrates a reduced disparity between the control forces $F_1$, $F_2$ for each of the actuators in the E/I core actuator pair 426 utilizing the control system 424 provided herein, particularly between t=1 and t=7. In this example, the disparity is generally within the range of zero N and approximately ±0.2N during both the acceleration and deceleration of the stage between t=1 and t=7.

Figure 7C:
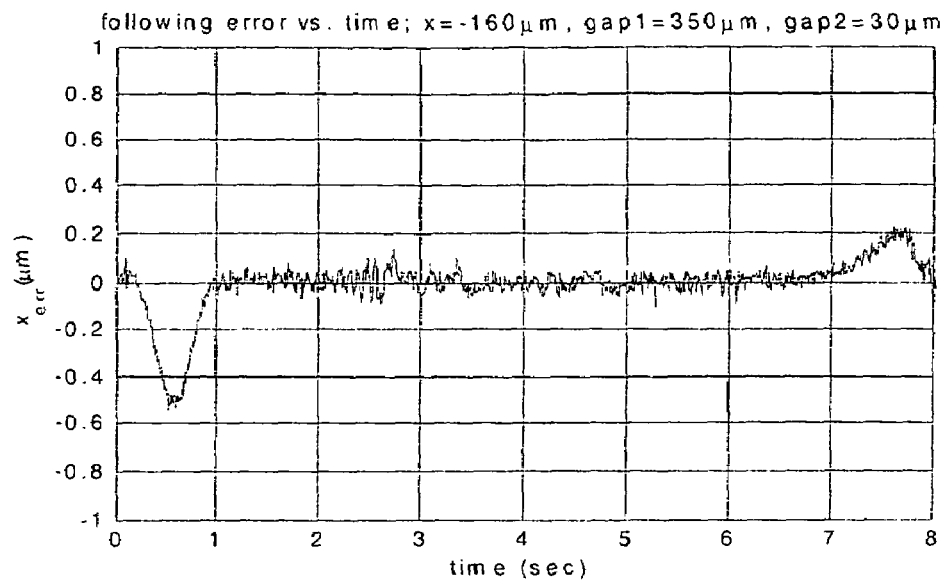
FIG. 7C is a graph plotting experimental results of following error as a function of time in a second embodiment of the present invention including the stage in a third position.

FIG. 7C is another graph that plots experimental results of following error $x_{err}$ versus time utilizing the stage assembly 420 (illustrated in FIG. 4A) having a control system 424 that uses the second calibration algorithm provided herein. In this example, an injected force with a maximum magnitude of 54N is applied to each of the two actuators 428F, 428S in the E/I core actuator pair 426. The force profile is a bell-shaped curve that is substantially similar to the curve previously illustrated in FIG. 5B. In FIG. 7C, $g_1$=350 μm, $g_2$=30 μm and x=160 μm. In other words, the centerline 456 of the stage 408 is positioned 160 μm from the physical range midpoint, i.e. toward the second electromagnet 436S (illustrated in FIG. 4A). FIG. 7C shows that for a majority of the experiment, the following error $x_{err}$ is relatively small, e.g., within the range of zero to 0.1 μm, and remains substantially consistent over time, despite changes in the applied force, particularly between t=1 and t=7.

Figure 7D:
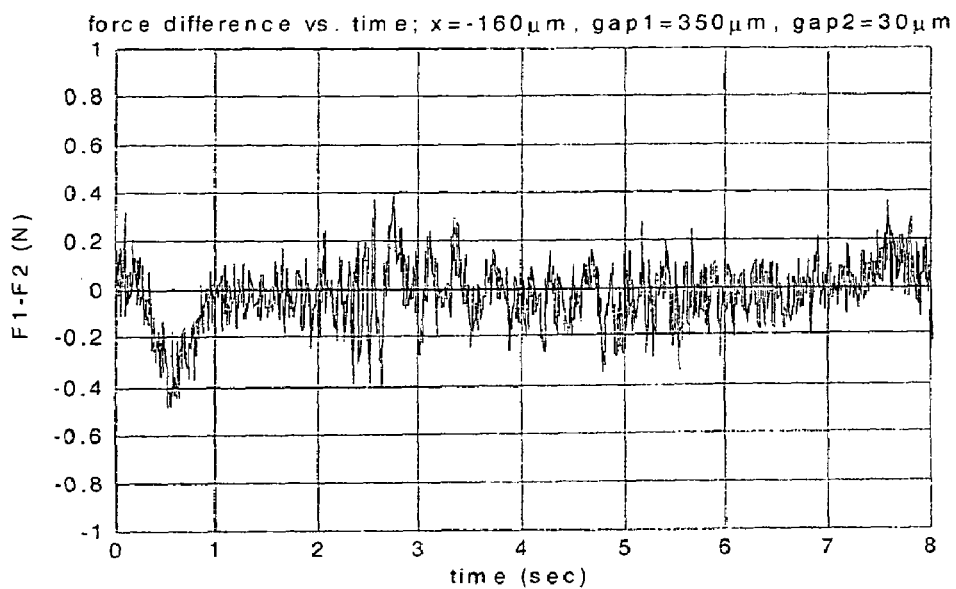
FIG. 7D is a graph plotting experimental results of force difference as a function of time in a second embodiment of the present invention including the stage in a third position.

FIG. 7D is a graph that plots force difference versus time between the forces applied to each of the two actuators 428F, 428S during the experiment described relative to FIG. 7C. FIG. 7D further illustrates a reduced disparity between the control forces $F_1$, $F_2$ for each of the actuators in the E/I core actuator pair 426 utilizing the control system 424 provided herein, particularly between t=1 and t=7. In this example, the disparity is generally within the range of zero N and approximately ±0.2N during both the acceleration and deceleration of the stage between t=1 and t=7.

In a third embodiment of the present invention, calibration of the functional range midpoint 460M relative to the physical range midpoint 458M during operation can occur using a lookup table. In this embodiment, once the desired force is determined by the control system, a lookup table is used to adjust the current that is directed to one or more of the actuators 428F, 428S (illustrated in FIGS. 4A and 4B) based on (i) the angle $\theta_1$, $\theta_2$ of one or more of the electromagnets 436F, 436S relative to the corresponding target surface(s) 442F, 442S at a given time or times; (ii) the gap error $\Delta g_1$, $\Delta g_2$ of one or more of the electromagnets 436F, 436S relative to the corresponding target surface(s) 442F, 442S at a given time or times; and/or (iii) the difference between the distance from two or more measurement points, (i.e. 446F and 450F, or 450S and 454S, as examples) on each of one or more of the electromagnets 436F, 436S and the corresponding target surface(s) 442F, 442S at a given time or times.

Figure 8A:
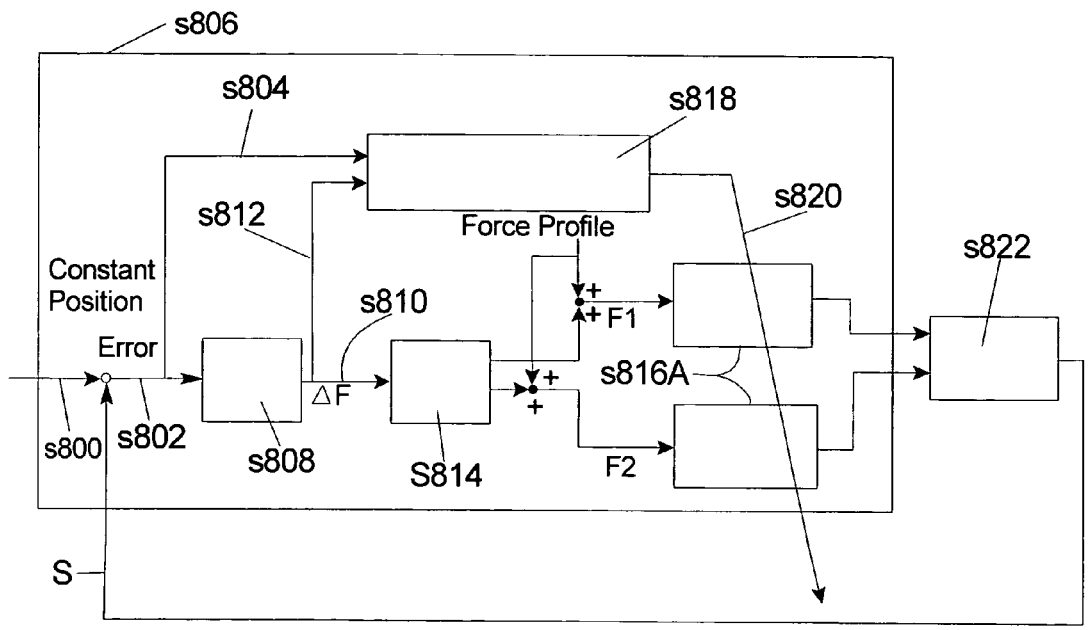
FIG. 8A is a block diagram that illustrates a system for controlling a portion of the stage assembly in FIG. 4A.

FIG. 8A is a simplified schematic that illustrates one embodiment of the sensing, control and calibration functions of the stage assembly 420 shown in FIG. 4A. A constant position target s800 is determined and fed into the control system. The constant position target s800 is compared with a sensor signal vector S, that is generated from the output of the measurement system 22 (illustrated in FIG. 1) measuring the position of the stage (illustrated in FIG. 4), to determine a difference vector s802. The difference vector s802 can then be input as a following error signal to one or more of the control system calibration formulas s818 previously described s804. Further, the difference vector s802 regarded as a following error signal can be calculated in the controller s808 (a program executed by a microprocessor or microcontroller). The controller s808 prescribes the corrective action s810 for the signal. The controller s808 may be in the form of a PID (proportional integral derivative) controller, proportional gain controller or a lead-lag filter, or other commonly known law in the art of control, for example. The corrective action as determined by the controller s808 can also be input s812 into one or more of the control system calibration formulas s818 described previously.

The controller s806 determines the amount of required net force ΔF s810, and determines the force s814 of each actuator to exert at a particular time to maintain the desired position of the stage. In the embodiment illustrated in FIG. 8A, the force profile $F_1$, $F_2$ required by each of the one or more actuators (two force profiles are depicted in FIG. 8A) to move the stage is converted to current during E/I commutation s816. Also during E/I commutation s816A, the control system s806 can utilize output information s820 from one or more of the calibration formulae s818 to modify the E/I commutation s816A for one or more of the actuators of the E/I core actuator pair.

Stated another way, the commutation formula s816A receives the force profile, uses one or more of the calibration formulae s818, and calculates the first current $I_1$ needed at the first actuator and the second current $I_2$ needed at the second actuator to attempt to produce the required net force ΔF to be exerted on the stage and maintain the stage at the desired position. The currents $I_1$, $I_2$ are directed to the respective actuators, and the actuators impart an actual force on the stage, and the stage responds to the input. The measurement system 22 monitors the movement of the stage s822, the sensor signal vector S changes, and the cycle is repeated.

Figure 8B:
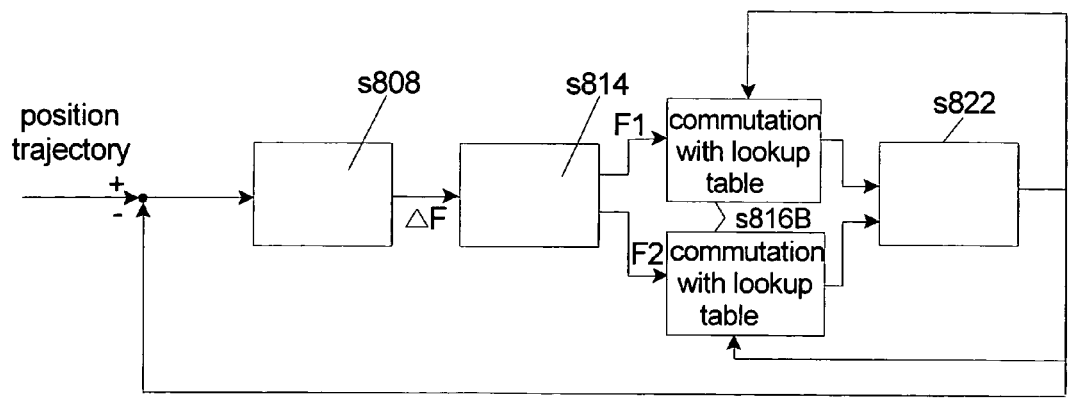
FIG. 8B is a block diagram that illustrates another embodiment of a system for controlling a portion of the stage assembly in FIG. 4A.

FIG. 8B is an alternative simplified schematic diagram of that illustrated in FIG. 8A. Because many of the steps illustrated in this embodiment are identical to those depicted in FIG. 8A, they have been omitted for simplification. In this embodiment, the force profile F1, F2 required by each of the one or more actuators (two force profiles are depicted in FIG. 8B) to move the stage is converted to current by using a lookup table s816B, rather than using a commutation formula.

Figure 9A:
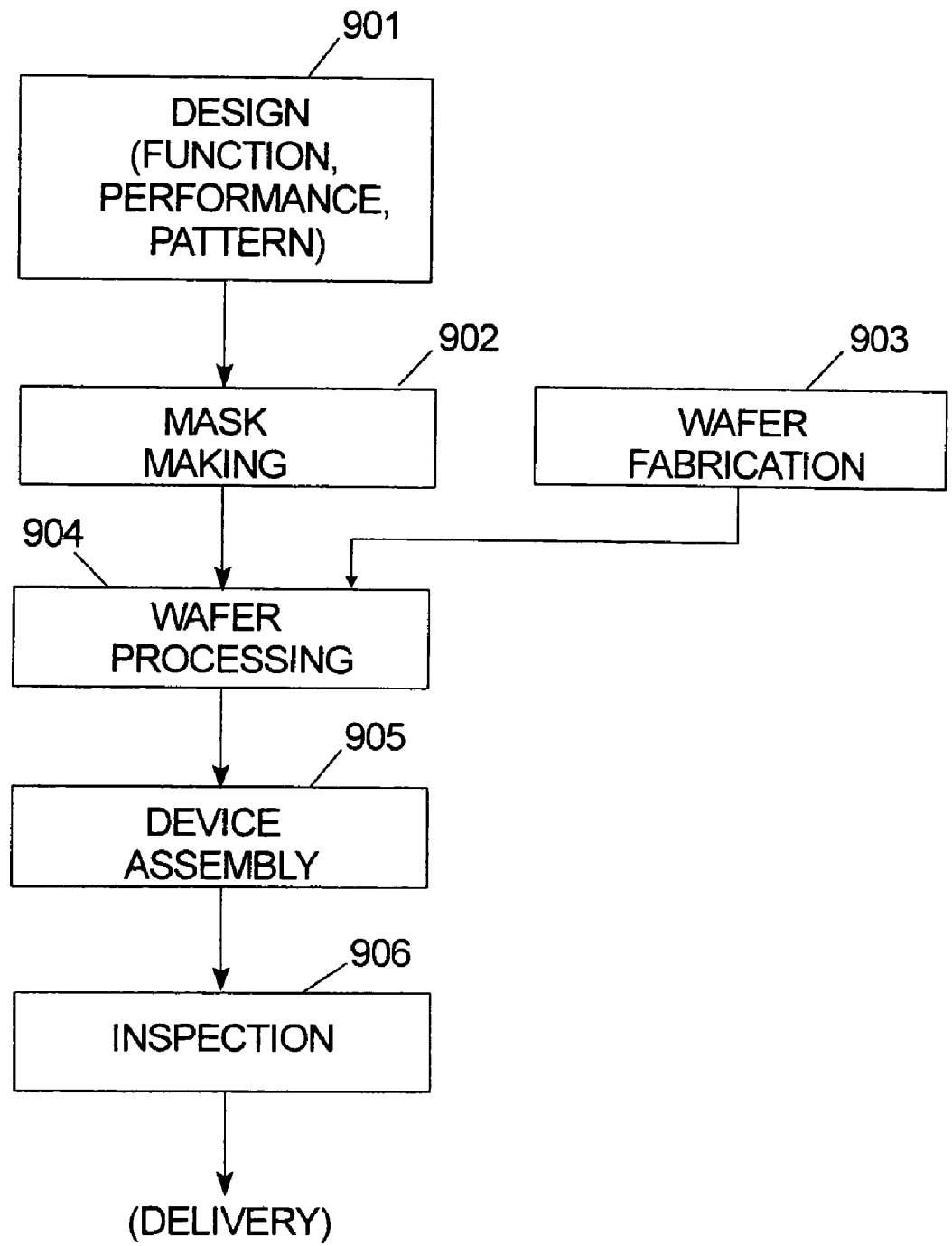
FIG. 9A is a flow chart that outlines a process for manufacturing a device in accordance with the present invention.

Semiconductor devices can be fabricated using the above described systems, by the process shown generally in FIG. 9A. In step 901 the device's function and performance characteristics are designed. Next, in step 902, a mask (reticle) having a pattern is designed according to the previous designing step, and in a parallel step 903 a wafer is made from a silicon material. The mask pattern designed in step 902 is exposed onto the wafer from step 903 in step 904 by a photolithography system described hereinabove in accordance with the present invention. In step 905 the semiconductor device is assembled (including the dicing process, bonding process and packaging process), finally, the device is then inspected in step 906.

Figure 9B:
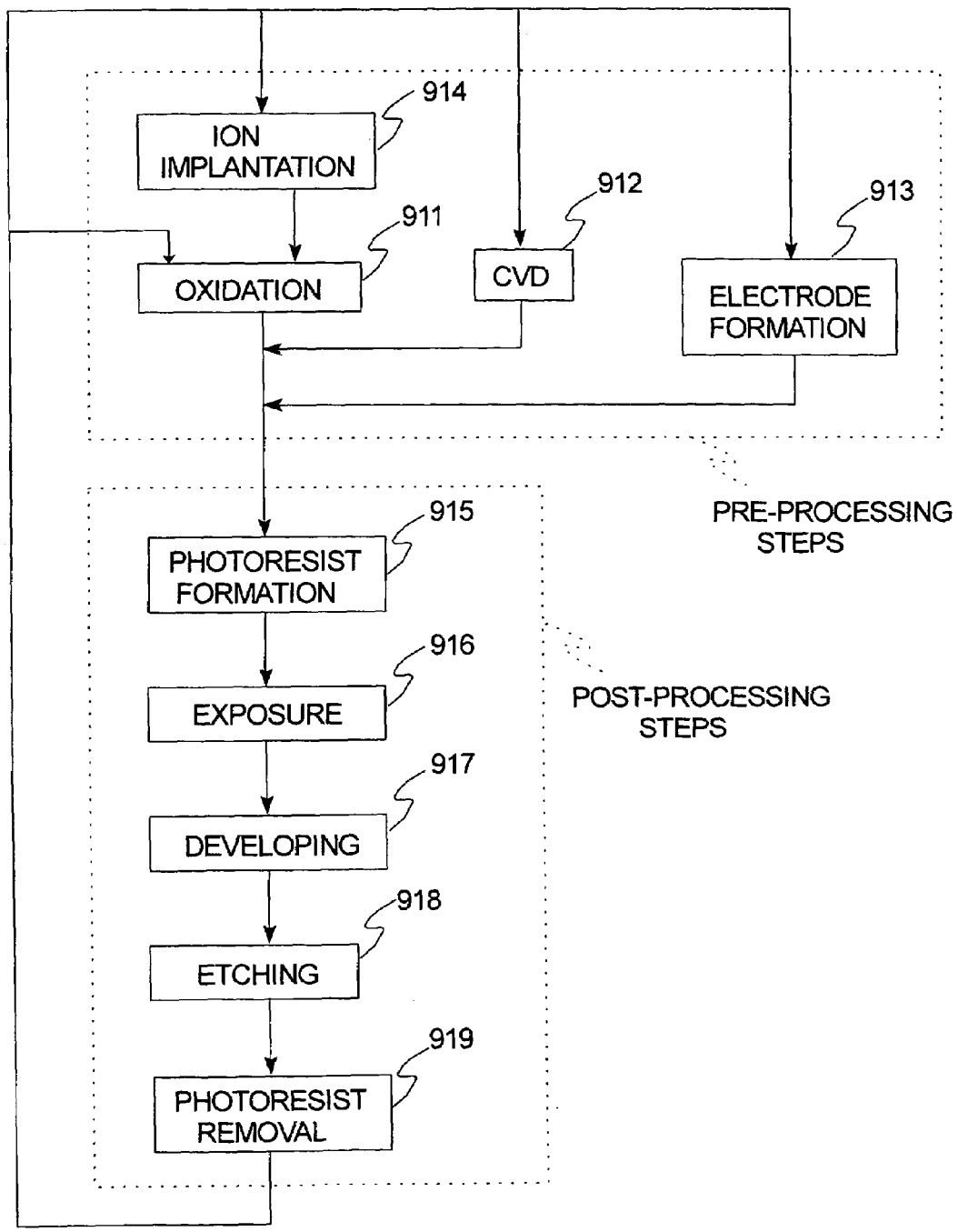
FIG. 9B is a flow chart that outlines device processing in more detail.

FIG. 9B illustrates a detailed flowchart example of the above-mentioned step 904 in the case of fabricating semiconductor devices. In FIG. 9B, in step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911–914 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 915 (photoresist formation step), photoresist is applied to a wafer. Next, in step 916 (exposure step), the above-mentioned exposure device is used to transfer the circuit pattern of a mask (reticle) to a wafer. Then in step 917 (developing step), the exposed wafer is developed, and in step 918 (etching step), parts other than residual photoresist (exposed material surface) are removed by etching. In step 919 (photoresist removal step), unnecessary photoresist remaining after etching is removed. Multiple circuit patterns are formed by repetition of these preprocessing and post-processing steps.

While the particular stage assembly and commutation formula as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly for positioning a device, the stage assembly comprising:
    a stage;
    a mover assembly that moves the stage, the mover assembly including an attraction-only type first actuator, the first actuator including a first target and a first electromagnet that is spaced apart from the first target, the first target having a first target surface that generally faces the first electromagnet, the first electromagnet being positioned at a first angle having an absolute value of greater than zero relative to the first target surface; and
    a control system that directs a first current to the first actuator based on the first angle.

2. The stage assembly of claim 1 wherein the first electromagnet includes an E core and the first target includes an I core.

3. The stage assembly of claim 1 wherein the first electromagnet includes a first measurement point that spaced apart a first physical gap $g_1$ from the first target surface, and a spaced apart second measurement point that is spaced apart a first functional gap $\bar{g}_1$ from the first target surface, $g_1$ being different than the $\bar{g}_1$, and wherein the control system directs the first current to the first actuator based on $g_1$ and $g\bar{g}_1$.

4. The stage assembly of claim 3 wherein the control system directs the first current to the first actuator based on the difference between $g_1$ and $\bar{g}_1$.

5. The stage assembly of claim 1 wherein the first current directed to the first actuator is calculated using the formula:

$$I_1 = \sqrt{\frac{[(g_o - \bar{x}) + a][(g_o - \bar{x}) + b]}{(g_o + a)(g_o + b)} \frac{F_1}{k}},$$

where $g_o$ is the nominal operating E-I gap, a is a first parameter, b is a second parameter, k is an E-I force constant, $F_1$ is a first desired force to be imposed on the stage, and $\bar{x}$ is the difference between a centerline of the stage and a functional range midpoint of the stage.

6. The stage assembly of claim 1 wherein the mover assembly includes an attraction-only type second actuator that cooperates with the first actuator to move the stage, the second actuator including a second target and a second electromagnet that is spaced apart from the second target, the second target having a second target surface that generally faces the second electromagnet, the second electromagnet being positioned at a second angle relative to the second target surface, wherein the control system directs a second current to the second actuator based on the second angle.

7. The stage assembly of claim 6 wherein the first actuator imposes a first force on the stage that is at least partially opposed by a second force imposed on the stage by the second actuator.

8. The stage assembly of claim 6 wherein the first actuator and the second actuator form an actuator pair.

9. The stage assembly of claim 6 wherein the first electromagnet includes an E core and the first target includes an I core.

10. The stage assembly of claim 9 wherein the second electromagnet includes an E core and the second target includes an I core.

11. The stage assembly of claim 6 wherein the second electromagnet includes a first measurement point that is spaced apart from the second target surface by a second physical gap $g_2$, and a spaced apart second measurement point that is spaced apart from the second target surface by a second functional gap $\bar{g}_2$, $g_2$ being different than $\bar{g}_2$, and wherein the control system directs the second current to the second actuator based on $g_2$ and $\bar{g}_2$.

12. The stage assembly of claim 11 wherein the first electromagnet includes a first measurement point that spaced apart a first physical gap $g_1$ from the first target surface, and a spaced apart second measurement point that is spaced apart a first functional gap $\bar{g}_1$ from the first target surface, $g_1$ being different than the $\bar{g}_1$, and wherein the control system directs the first current to the first actuator based on $g_1$ and $\bar{g}_1$.

13. The stage assembly of claim 11 wherein the control system directs the second current to the second actuator based on the difference between the $g_2$ and $\bar{g}_2$.

14. The stage assembly of claim 6 wherein the first angle is different than the second angle.

15. The stage assembly of claim 14 wherein the control system directs current to at least one of the actuators based on the difference between the first angle and the second angle.

16. The stage assembly of claim 14 wherein the control system directs current to each of the actuators based on the difference between the first angle and the second angle.

17. An exposure apparatus including an illumination source and the stage assembly of claim 1 positioned near the illumination source.

18. A device manufactured with the exposure apparatus according to claim 17.

19. A wafer on which an image has been formed by the exposure apparatus of claim 17.

20. A stage assembly for positioning a device, the stage assembly comprising:
a stage;
a mover assembly that moves the stage, the mover assembly including an attraction-only type first actuator, the first actuator including a first target and a first electromagnet that is spaced apart from the first target, the first target having a first target surface that generally faces the first electromagnet, the first electromagnet including a first measurement point that spaced apart a first physical gap $g_1$ from the first target surface, and a spaced apart second measurement point that is spaced apart a first functional gap $\bar{g}_1$ from the first target surface, $g_1$ being different than the $\bar{g}_1$; and
a control system that directs a first current to the first actuator based on $g_1$ and $\bar{g}_1$.

21. The stage assembly of claim 20 wherein the first electromagnet includes an E core and the first target includes an I core.

22. The stage assembly of claim 20 wherein the control system directs the first current to the first actuator based on the difference between $g_1$ and $\bar{g}_1$.

23. The stage assembly of claim 20 wherein the first current directed to the first actuator is calculated using the formula:

$$I_1 = \sqrt{\frac{[(g_o - \bar{x}) + a][(g_o - \bar{x}) + b]}{(g_o + a)(g_o + b)} \frac{F_1}{k}},$$

where $g_o$ is the nominal operating E-I gap, a is a first parameter, b is a second parameter, k is an E-I force constant, $F_1$ is a first desired force to be imposed on the stage, and $\bar{x}$ is the difference between a centerline of the stage and functional range midpoint of the stage.

24. The stage assembly of claim 20 wherein the mover assembly includes an attraction-only type second actuator that cooperates with the first actuator to move the stage, the second actuator including a second target and a second electromagnet that is spaced apart from the second target, the second target having a second target surface that generally faces the second electromagnet, the second electromagnet including a first measurement point that spaced apart a second physical gap $g_2$ from the second target surface, and a spaced apart second measurement point that is spaced apart a second functional gap $\bar{g}_2$ from the second target surface, $g_2$ being different than the $\bar{g}_2$, and wherein the control system directs the second current to the first actuator based on $g_2$ and $\bar{g}_2$.

25. The stage assembly of claim 24 wherein the first actuator imposes a first force on the stage that is at least partially opposed by a second force imposed on the stage by the second actuator.

26. The stage assembly of claim 24 wherein the first actuator and the second actuator form an actuator pair.

27. The stage assembly of claim 24 wherein the first electromagnet includes an E core and the first target includes an I core.

28. The stage assembly of claim 27 wherein the second electromagnet includes an E core and the second target includes an I core.

29. The stage assembly of claim 24 wherein the control system directs the second current to the second actuator based on the difference between the $g_2$ and $\bar{g}_2$.

30. The stage assembly of claim 24 wherein the first electromagnet is positioned at a first angle relative to the first target surface, and wherein the control system directs the first current to the first actuator based on the first angle.

31. The stage assembly of claim 30 wherein the second electromagnet is positioned at a second angle relative to the second target surface, wherein the control system directs a second current to the second actuator based on the second angle.

32. The stage assembly of claim 31 wherein the first angle is different than the second angle.

33. The stage assembly of claim 31 wherein the control system directs current to at least one of the actuators based on the difference between the first angle and the second angle.

34. The stage assembly of claim 31 wherein the control system directs current to each of the actuators based on the difference between the first angle and the second angle.

35. An exposure apparatus including an illumination source and the stage assembly of claim 20 positioned near the illumination source.

36. A device manufactured with the exposure apparatus according to claim 35.

37. A wafer on which an image has been formed by the exposure apparatus of claim 35.

38. A method for positioning a stage, the method comprising the steps of:
coupling a first actuator to the stage, the first actuator including a first electromagnet and a first target having a first target surface, the first electromagnet being positioned at a first angle having an absolute value greater than zero relative to the first target surface; and
directing current to the first actuator with a control system based on the first angle.

39. The method of claim 38 further comprising the step of coupling a second actuator to the stage, the second actuator including a second electromagnet and a second target having a second target surface, the second electromagnet being positioned at a second angle relative to the second target surface, the second actuator cooperating with the first actuator to move the stage.

40. The method of claim 39 further comprising the step of directing current to the second actuator with the control system based on the second angle.

41. The method of claim 39 wherein the one of the step of directing current to the first actuator and the step of directing current to the second actuator is based on the difference between the first angle and the second angle.

42. The method of claim 39 wherein the steps of directing current to the first actuator and directing current to the second actuator are each based on the difference between the first angle and the second angle.

43. The method of claim 39 wherein one of the actuators is an attraction-only type actuator.

44. A method for using an exposure apparatus to transfer an image onto a device, the method comprising the steps of:
retaining the device with a stage; and
positioning the stage utilizing the method of claim 38.

45. A method for making an object which utilizes the method for using the exposure apparatus of claim 44.

46. A method of making a wafer which utilizes the method for using the exposure apparatus of claim 44.

47. A method for positioning a stage, the method comprising the steps of:

coupling a first actuator to the stage, the first actuator including a first electromagnet and a first target having a first target surface that generally faces the first electromagnet, the first electromagnet including a first measurement point that spaced apart a first physical gap $g_1$ from the first target surface, and a spaced apart second measurement point that is spaced apart a first functional gap $\bar{g}_1$ from the first target surface, $g_1$ being different than the $\bar{g}_1$; and directing current to the first actuator with a control system based on $g_1$ and $\bar{g}_1$.

48. The method of claim 47 further comprising the step of coupling a second actuator to the stage, the second actuator including a second electromagnet and a second target having a second target surface that generally faces the second electromagnet, the second electromagnet including a first measurement point that spaced apart a second physical gap $g_2$ from the second target surface, and a spaced apart second measurement point that is spaced apart a second functional gap $\bar{g}_2$ from the first target surface, $g_2$ being different than the $\bar{g}_2$.

49. The method of claim 48 further comprising the step of directing current to the second actuator with the control system based on $g_2$ and $\bar{g}_2$.

50. The method of claim 49 wherein one of the actuators is an attraction-only type actuator.

51. A method for using an exposure apparatus to transfer an image onto a device, the method comprising the steps of:

retaining the device with a stage; and positioning the stage utilizing the method of claim 47.

52. A method for making an object which utilizes the method for using the exposure apparatus of claim 51.

53. A method of making a wafer which utilizes the method for using the exposure apparatus of claim 51.

* * * * *

UNITED STATES PATENT AND TRADEMARK OFFICE
CERTIFICATE OF CORRECTION

| | | |
|---|---|---|
| PATENT NO. | : 7,034,474 B2 | Page 1 of 1 |
| APPLICATION NO. | : 10/775720 | |
| DATED | : April 25, 2006 | |
| INVENTOR(S) | : Pai Hsueh Yang et al. | |

It is certified that error appears in the above-identified patent and that said Letters Patent is hereby corrected as shown below:

In column 21, Claim 3, line number 8, please replace: "$g\bar{g}_1$"

with -- $\bar{g}_1$ --.

Signed and Sealed this

Twenty-eighth Day of November, 2006

JON W. DUDAS
*Director of the United States Patent and Trademark Office*